(12) United States Patent
Michaelson et al.

(10) Patent No.: US 7,534,627 B2
(45) Date of Patent: May 19, 2009

(54) METHODS AND SYSTEMS FOR CONTROLLING CRITICAL DIMENSIONS IN TRACK LITHOGRAPHY TOOLS

(75) Inventors: Tim Michaelson, Milpitas, CA (US); Nikolaos Bekiaris, Santa Clara, CA (US)

(73) Assignee: Sokudo Co., Ltd., Kyoto (JP)

( * ) Notice: Subject to any disclaimer, the term of this patent is extended or adjusted under 35 U.S.C. 154(b) by 0 days.

(21) Appl. No.: 11/834,518

(22) Filed: Aug. 6, 2007

(65) Prior Publication Data

US 2008/0032426 A1 Feb. 7, 2008

Related U.S. Application Data

(60) Provisional application No. 60/836,310, filed on Aug. 7, 2006, provisional application No. 60/836,248, filed on Aug. 7, 2006.

(51) Int. Cl.
- *H01L 21/00* (2006.01)
- *G06F 19/00* (2006.01)
- *H05B 3/68* (2006.01)

(52) U.S. Cl. .................. 438/5; 700/121; 219/444.1

(58) Field of Classification Search ............... None
See application file for complete search history.

(56) References Cited

U.S. PATENT DOCUMENTS

| | | | |
|---|---|---|---|
| 6,720,533 B2* | 4/2004 | Keum et al. | 219/444.1 |
| 6,957,120 B1* | 10/2005 | Bode et al. | 700/121 |
| 6,992,270 B2* | 1/2006 | Lee et al. | 219/444.1 |
| 7,076,320 B1* | 7/2006 | Phan et al. | 700/121 |
| 7,101,816 B2* | 9/2006 | Kaushal et al. | 438/795 |
| 7,186,650 B1* | 3/2007 | Dakshina-Murthy | 438/689 |
| 7,356,380 B2* | 4/2008 | Yu et al. | 700/121 |
| 7,403,834 B2* | 7/2008 | Poolla et al. | 700/121 |
| 2006/0222975 A1* | 10/2006 | Ke et al. | 430/30 |
| 2006/0238954 A1 | 10/2006 | Ishikawa et al. | |
| 2007/0000441 A1 | 1/2007 | Lue | |
| 2008/0006619 A1 | 1/2008 | Salinas | |

OTHER PUBLICATIONS

International Search Report and Written Opinion of PCT Application No. PCT/US07/75344, dated Aug. 8, 2008, 10 pages total.

* cited by examiner

*Primary Examiner*—Scott B Geyer
(74) *Attorney, Agent, or Firm*—Townsend & Townsend & Crew LLP

(57) ABSTRACT

A method of controlling wafer critical dimension (CD) uniformity on a track lithography tool includes obtaining a CD map for a wafer. The CD map includes a plurality of CD data points correlated with a multi-zone heater geometry map. The multi-zone heater includes a plurality of heater zones. The method also includes determining a CD value for a first heater zone of the plurality of heater zones based on one or more of the CD data points and computing a difference between the determined CD value for the first heater zone and a target CD value for the first heater zone. The method further includes determining a temperature variation for the first heater zone based, in part, on the computed difference and a temperature sensitivity of a photoresist deposited on the wafer and modifying a temperature of the first heater zone based, in part, on the temperature variation.

20 Claims, 11 Drawing Sheets

METHODS AND SYSTEMS FOR CONTROLLING CRITICAL DIMENSIONS IN TRACK LITHOGRAPHY TOOLS

CROSS-REFERENCES TO RELATED APPLICATIONS

This application claims priority to U.S. Provisional Patent Application No. 60/836,310, filed on Aug. 7, 2006 and to U.S. Provisional Patent Application No. 60/836,248, filed on Aug. 7, 2006, the disclosures of which are incorporated by reference herein for all purposes.

BACKGROUND OF THE INVENTION

The present invention relates generally to the field of substrate processing equipment. More particularly, the present invention relates to methods and apparatus for providing control of critical dimensions during lithography processes. Merely by way of example, embodiments of the present invention have been applied to controlling critical dimension across a semiconductor wafer by control of a zoned heater plate. However, the present invention has broader applicability and can be applied to other processes for semiconductor substrates, for example, modification of bake plate temperature based on a measurement wafer.

Modern integrated circuits contain millions of individual elements that are formed by patterning the materials, such as silicon, metal and/or dielectric layers, that make up the integrated circuit to sizes that are small fractions of a micrometer. The technique used throughout the industry for forming such patterns is photolithography. A typical photolithography process sequence generally includes depositing one or more uniform photoresist (resist) layers on the surface of a substrate, drying and curing the deposited layers, patterning the substrate by exposing the photoresist layer to electromagnetic radiation that is suitable for modifying the exposed layer and then developing the patterned photoresist layer.

It is common in the semiconductor industry for many of the steps associated with the photolithography process to be performed in a multi-chamber processing system (e.g., a cluster tool) that has the capability to sequentially process semiconductor wafers in a controlled manner. One example of a cluster tool that is used to deposit (i.e., coat) and develop a photoresist material is commonly referred to as a track lithography tool.

Track lithography tools typically include a mainframe that houses multiple chambers (which are sometimes referred to herein as stations or modules) dedicated to performing the various tasks associated with pre- and post-lithography processing. There are typically both wet and dry processing chambers within track lithography tools. Wet chambers include coat and/or develop bowls, while dry chambers include thermal control units that house bake and/or chill plates. Track lithography tools also frequently include one or more pod/cassette mounting devices, such as an industry standard FOUP (front opening unified pod), to receive substrates from and return substrates to the clean room, multiple substrate transfer robots to transfer substrates between the various chambers/stations of the track tool and an interface that allows the tool to be operatively coupled to a lithography exposure tool in order to transfer substrates into the exposure tool and receive substrates from the exposure tool after the substrates are processed within the exposure tool.

Over the years there has been a strong push within the semiconductor industry to shrink the size of semiconductor devices. The reduced feature sizes have caused the industry's tolerance to process variability to shrink, which in turn, has resulted in semiconductor manufacturing specifications having more stringent requirements for process uniformity and repeatability. An important factor in minimizing process variability during track lithography processing sequences is to ensure that substrates processed within the chambers of the track lithography tool are characterized by a controllable (usually spatially uniform) critical dimension (CD) across the substrate surface. Variations in the wafer CD can result in reliability problems and adversely impact device yield.

In view of these requirements, methods and techniques are needed to provide controllable wafer CD during semiconductor processing operations using track lithography tools and other types of cluster tools.

SUMMARY OF THE INVENTION

According to an embodiment of the present invention, a method of controlling wafer critical dimension (CD) uniformity on a track lithography tool is provided. The method includes obtaining a CD map for a wafer. The CD map includes a plurality of CD data points correlated with a multi-zone heater geometry map. In embodiments of the present invention, the multi-zone heater includes a plurality of heater zones. The method also includes determining a CD value for a first heater zone of the plurality of heater zones based on one or more of the CD data points, computing a difference between the determined CD value for the first heater zone and a target CD value for the first heater zone, and determining a temperature variation for the first heater zone based, in part, on the computed difference and a temperature sensitivity of a photoresist deposited on the wafer. The method further includes modifying a temperature of the first heater zone based, in part, on the temperature variation.

According to another embodiment of the present invention, a method of controlling CD during processing of semiconductor wafers is provided. The method includes measuring a CD profile for a first semiconductor wafer, comparing the measured CD profile with a target CD profile, and determining that the measured CD profile is not within a predetermined tolerance of the target CD profile. The method also includes calculating a temperature offset for a zone of a multi-zone bake plate based on the determining step, modifying a temperature set point of the zone of the multi-zone bake plate, and processing a second semiconductor wafer using the modified temperature set point.

According to yet another embodiment of the present invention, a track lithography tool is provided. The track lithography tool includes a factory interface configured to receive a wafer and a process module coupled to the factory interface. The process module includes a plurality of coat stations, a plurality of develop stations, and a thermal treatment unit including a multi-zone bake plate including a plurality of heater zones and characterized by a multi-zone bake plate geometry map. The track lithography tool also includes a controller configured to receive a CD map for the wafer. The CD map includes a plurality of CD data points correlated with the multi-zone bake plate geometry map. The controller also includes a computer-readable medium storing a plurality of instructions for controlling a data processor to modify a wafer CD profile. The plurality of instructions include instructions that cause the data processor to determine a CD value for a first heater zone of the plurality of heater zones based on one or more of the CD data points and instructions that cause the data processor to compute a difference between the determined CD value for the first heater zone and a target CD value for the first heater zone. The plurality of instructions also include instructions that cause the data processor to determine a temperature variation for the first heater zone based, in part, on the computed difference and a temperature sensitivity of a photoresist deposited on the wafer and instructions that cause the data processor to modify a temperature of the first heater zone based, in part, on the temperature variation.

According to an alternative embodiment of the present invention, a method of controlling wafer critical dimension uniformity on a track lithography tool is provided. The method includes obtaining a CD map for a wafer. The CD map may be obtained using an OCD metrology tool. The CD map includes a plurality of CD data points (e.g., 66 or more data points). The method also includes overlaying the CD map onto a zoned-heater geometry map. In embodiments, the zoned-heater geometry is based on a zoned-heater including a plurality of zones. The method further includes assigning each of the plurality of CD data points to at least one of the plurality of zones, determining a temperature sensitivity of a photoresist associated with the wafer, and determining a temperature variation for at least one of the plurality of zones based, in part, on one or more of the plurality of CD data points. The temperature sensitivity may be associated with a slope of a CD versus temperature curve. Moreover, the method includes modifying a temperature of one or more of the plurality of zones based, in part, on the temperature variation.

According to a specific alternative embodiment, the method additionally includes repeating the obtaining, overlaying, assigning, determining a temperature variation, and modifying steps one or more times. As an example, repeating modifies a measured wafer CD to obtain a wafer CD within a predetermined value of a target wafer CD. Furthermore, the method may include averaging a subset of the plurality of CD data points associated with a zone of the plurality of zones, thereby providing a zone CD average.

Many benefits are achieved by way of the present invention over conventional techniques. For example, embodiments of the present invention provide for improved CD uniformity in comparison with conventional techniques. Additionally, embodiments provide a method of adjusting within-wafer CD uniformity that can be used as a framework for advanced process control on a lot-to-lot or even wafer-to-wafer level. Furthermore, the technique is not limited to achieving optimum CD uniformity, but can also be used to achieve a particular, non-uniform CD distribution across a wafer. The methods and algorithms described herein also allow optimized uniformity profiles to be achieved in fewer iteration than by manual adjustment. Depending upon the embodiment, one or more of these benefits, as well as other benefits, may be achieved. These and other benefits will be described in more detail throughout the present specification and more particularly below in conjunction with the following drawings.

BRIEF DESCRIPTION OF THE DRAWINGS

FIG. 3A is a top plan view of an example of a multi-zone bake plate that includes six different electrically independently heating zones according to an embodiment of the present invention;

DETAILED DESCRIPTION OF SPECIFIC EMBODIMENTS

Figure 1:
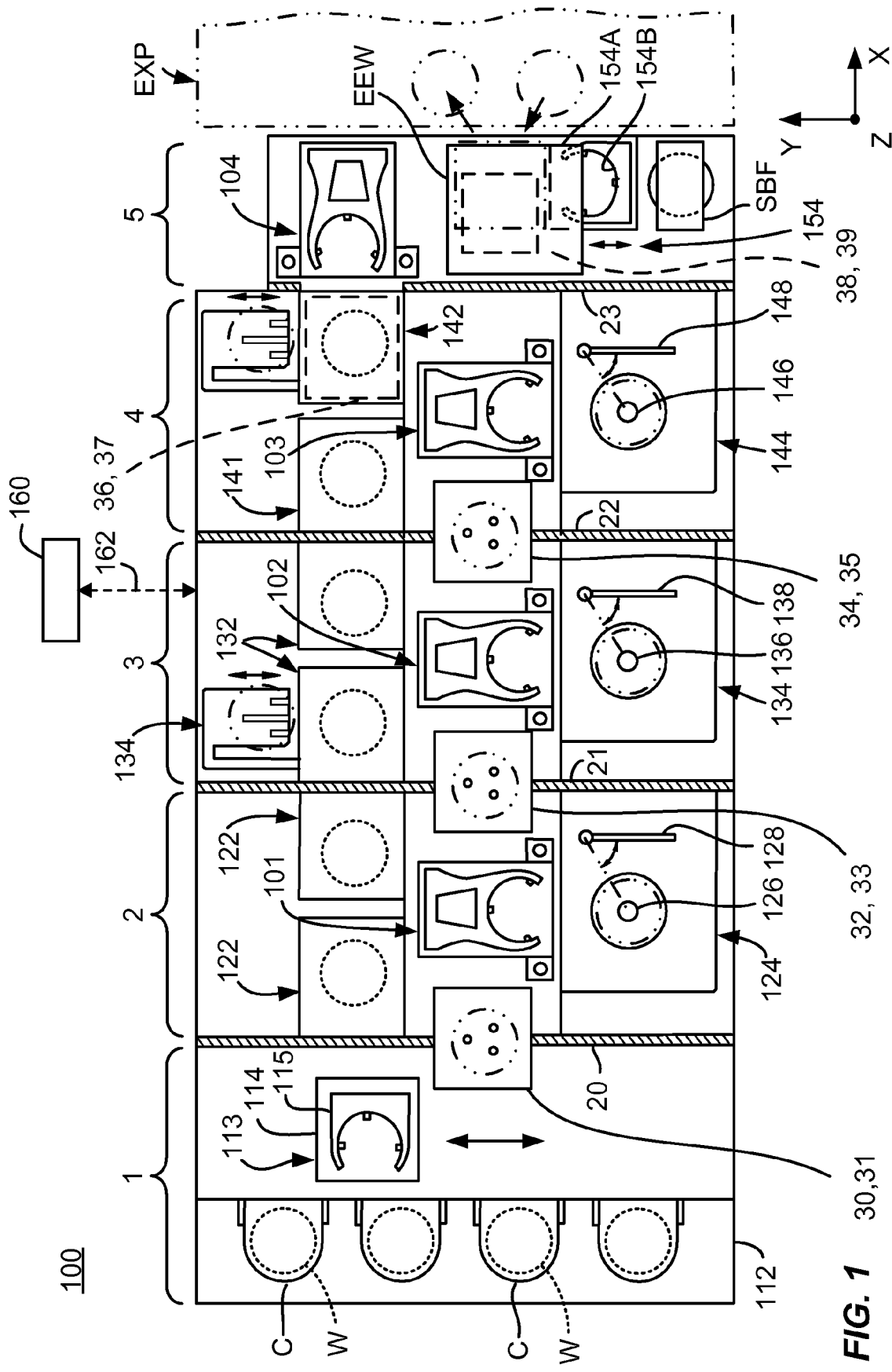
FIG. 1 is a simplified plan view of a track lithography tool according to an embodiment of the present invention.

FIG. 1 is a plan view of a track lithography tool according to an embodiment of the present invention. In the embodiment illustrated in FIG. 1, the track lithography tool is coupled to an immersion scanner. An XYZ rectangular coordinate system in which an XY plane is defined as the horizontal plane and a Z axis is defined to extend in the vertical direction is additionally shown in FIG. 1 for purposes of clarifying the directional relationship therebetween.

In a particular embodiment, the track lithography tool is used to form, through use of a coating process, an anti-reflection (AR) and a photoresist film on substrates, for example, semiconductor wafers. The track lithography tool is also used to perform a development process on the substrates after they have been subjected to a pattern exposure process. Additional processes performed on the track lithography tool, which may be coupled to an immersion scanner, include PEB and the like. The substrates processed by the track lithography tool are not limited to semiconductor wafers, but may include glass substrates for a liquid crystal display device, and the like.

The track lithography tool 100 illustrated in FIG. 1 includes an factory interface block 1, a BARC (Bottom Anti-Reflection Coating) block 2, a resist coating block 3, a development processing block 4, and a scanner interface block 5. In the track lithography tool, the five processing blocks 1 to 5 are arranged in a side-by-side relation. An exposure unit (or stepper) EXP, which is an external apparatus separate from the track lithography tool is provided and coupled to the scanner interface block 5. Additionally, the track lithography tool and the exposure unit EXP are connected via LAN lines 162 to a host computer 160.

The factory interface block 1 is a processing block for transferring unprocessed substrates received from outside of the track lithography tool to the BARC block 2 and the resist coating block 3. The factory interface block 1 is also useful for transporting processed substrates received from the development processing block 4 to the outside of the track lithography tool. The factory interface block 1 includes a table 112 configured to receive a number of (in the illustrated embodiment, four) cassettes (or carriers) C, and a substrate transfer mechanism 113 for retrieving an unprocessed substrate W from each of the cassettes C and for storing a processed substrate W in each of the cassettes C. The substrate transfer mechanism 113 includes a movable base 114, which is movable in the Y direction (horizontally) along the table 112, and a robot arm 115 mounted on the movable base 114.

The robot arm 115 is configured to support a substrate W in a horizontal position during wafer transfer operations. Additionally, the robot arm 115 is capable of moving in the Z direction (vertically) in relation to the movable base 114, pivoting within a horizontal plane, and translating back and forth in the direction of the pivot radius. Thus, using the substrate transfer mechanism 113, the holding arm 115 is able to gain access to each of the cassettes C, retrieve an unprocessed substrate W out of each cassette C, and store a processed substrate W in each cassette C. The cassettes C may be one or several types including: an SMIF (standard mechanical interface) pod; an OC (open cassette), which exposes stored substrates W to the atmosphere; or a FOUP (front opening unified pod), which stores substrates W in an enclosed or sealed space.

The BARC block 2 is positioned adjacent to the factory interface block 1. Partition 20 may be used to provide an atmospheric seal between the factory interface block 1 and the BARC block 2. The partition 20 is provided with a pair of vertically arranged substrate rest parts 30 and 31 each used as a transfer position when transferring a substrate W between the factory interface block 1 and the BARC block 2.

Referring to FIG. 1 again, BARC block 2 includes a bottom coating processor 124 configured to coat the surface of a substrate W with the AR film, a pair of thermal processing towers 122 for performing one or more thermal processes that accompany the formation of the AR film, and the transport robot 101, which is used in transferring and receiving a substrate W to and from the bottom coating processor 124 and the pair of thermal processing towers 122. Each of the coating processing units includes a spin chuck 126 on which the substrate W is rotated in a substantially horizontal plane while the substrate W is held in a substantially horizontal position through suction. Each coating processing unit also includes a coating nozzle 128 used to apply a coating solution for the AR film onto the substrate W held on the spin chuck 126, a spin motor (not shown) configured to rotatably drive the spin chuck 126, a cup (not shown) surrounding the substrate W held on the spin chuck 22, and the like.

The resist coating block 3 is a processing block for forming a resist film on the substrate W after formation of the AR film in the BARC block 2. In a particular embodiment, a chemically amplified resist is used as the photoresist. The resist coating block 3 includes a resist coating processor 134 used to form the resist film on top of the AR film, a pair of thermal processing towers 132 for performing one or more thermal processes accompanying the resist coating process, and the transport robot 102, which is used to transfer and receive a substrate W to and from the resist coating processor 134 and the pair of thermal processing towers 132. Each of the coating processing units includes a spin chuck 136, a coating nozzle 138 for applying a resist coating to the substrate W, a spin motor (not shown), a cup (not shown), and the like.

The thermal processing towers 132 include a number of vertically stacked bake chambers and cool plates. In a particular embodiment, the thermal processing tower closest to the factory interface block 1 includes bake chambers and the thermal processing tower farthest from the factory interface block 1 includes cool plates. In the embodiment illustrated in FIG. 1, the bake chambers include a vertically stacked bake plate and temporary substrate holder as well as a local transport mechanism 134 configured to move vertically and horizontally to transport a substrate W between the bake plate and the temporary substrate holder and may include an actively chilled transport arm. The transport robot 102 is identical in construction to the transport robot 101 in some embodiments. The transport robot 102 is able to independently access substrate rest parts 32 and 33, the thermal processing towers 132, the coating processing units provided in the resist coating processor 134, and the substrate rest parts 34 and 35.

The development processing block 4 is positioned between the resist coating block 3 and the scanner interface block 5. A partition 22 for sealing the development processing block from the atmosphere of the resist coating block 3 is provided. The development processing block 4 includes a development processor 144 for applying a developing solution to a substrate W after exposure in the scanner EXP, a pair of thermal processing towers 141 and 142, and transport robot 103. Each of the development processing units includes a spin chuck 146, a nozzle 148 for applying developer to a substrate W, a spin motor (not shown), a cup (not shown), and the like.

The interface block 5 is used to transfer a coated substrate W to the scanner EXP and to transfer an exposed substrate to the development processing block 5. The interface block 5 in this illustrated embodiment includes a transport mechanism 154 for transferring and receiving a substrate W to and from the exposure unit EXP, a pair of edge exposure units EEW for exposing the periphery of a coated substrate, and transport robot 104. Substrate rest parts 39 and 39 are provided along with the pair of edge exposure units EEW for transferring substrates to and from the scanner and the development processing unit 4.

The transport mechanism 154 includes a movable base 154A and a holding arm 154B mounted on the movable base 154A. The holding arm 154B is capable of moving vertically, pivoting, and moving back and forth in the direction of the pivot radius relative to the movable base 154A. The send buffer SBF is provided to temporarily store a substrate W prior to the exposure process if the exposure unit EXP is unable to accept the substrate W, and includes a cabinet capable of storing a plurality of substrates W in tiers.

Controller 160 is used to control all of the components and processes performed in the cluster tool. The controller 160 is generally adapted to communicate with the scanner 5, monitor and control aspects of the processes performed in the cluster tool, and is adapted to control all aspects of the complete substrate processing sequence. The controller 160, which is typically a microprocessor-based controller, is configured to receive inputs from a user and/or various sensors in one of the processing chambers and appropriately control the processing chamber components in accordance with the various inputs and software instructions retained in the controller's memory. The controller 160 generally contains memory and a CPU (not shown) which are utilized by the controller to retain various programs, process the programs, and execute the programs when necessary. The memory (not shown) is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits (not shown) are also connected to the CPU for supporting the processor in a conventional manner. The support circuits may include cache, power supplies, clock circuits, input/output circuitry, subsystems, and the like all well known in the art. A program (or computer instructions) readable by the controller 160 determines which tasks are performable in the processing chambers. Preferably, the program is software readable by the controller 160 and includes instructions to monitor and control the process based on defined rules and input data.

Additional description of a substrate processing apparatus in accordance with embodiments of the present invention is provided in U.S. Patent Application Publication No. 2006/0245855, entitled "Substrate Processing Apparatus," the disclosure of which is hereby incorporated by reference in its entirety. Although embodiments of the present invention are described herein in the context of the track lithography tool illustrated in FIG. 1, other architectures for track lithography tools are included within the scope of embodiments of the present invention. For example, track lithography tools utilizing Cartesian architectures are suitable for use with embodiments as described throughout the present specification. In a particular embodiment, implementation is performed for an $RF^3i$, available from Sokudo Co., Ltd., of Kyoto, Japan.

Figure 2:
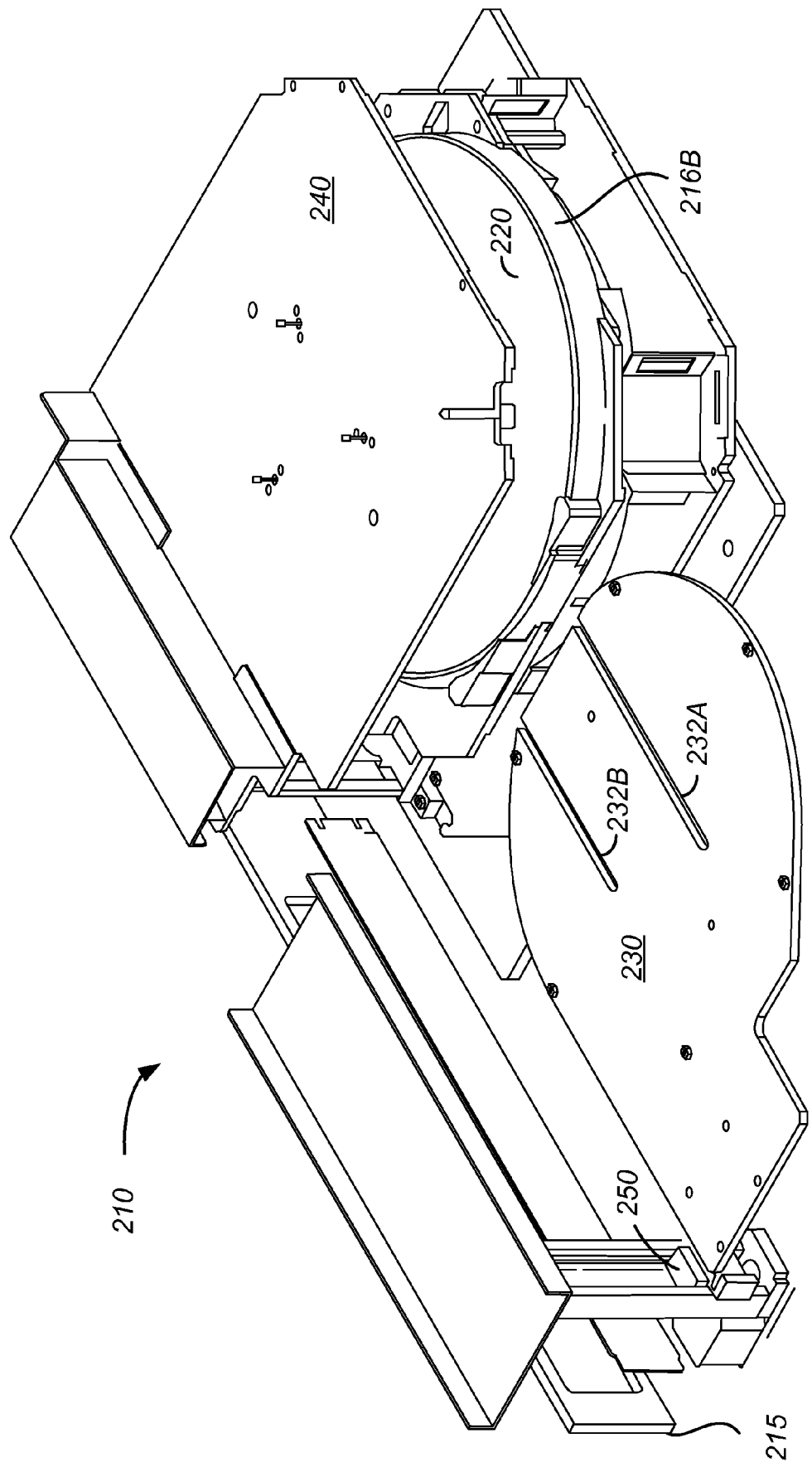
FIG. 2 is a simplified perspective view of an integrated thermal unit according to an embodiment of the present invention.

FIG. 2 is a simplified perspective view of an integrated thermal unit according to an embodiment of the present invention. The integrated thermal unit 210 may be utilized in the thermal processing towers illustrated in FIG. 1, providing both bake and chill processes in a single integrated unit. Referring to FIG. 2, the integrated thermal unit 210 includes a bake station 220, a transfer shuttle 230, and a chill plate 240. For purposes of clarity, various components of the integrated thermal unit 210, including control electronics, the exterior housing, motorized lifts, and the like, are not illustrated in FIG. 2.

Although not shown completely in FIG. 2, the integrated thermal unit 210 includes an exterior housing made of aluminum or another suitable material. Portions of the housing are illustrated by panels 215. The exterior housing provides a unit in which the various bake station components are housed in a compact arrangement. The exterior housing also allows multiple integrated thermal units to be stacked on top of each other in a track lithography tool as described above with respect to FIG. 1. The housing includes one or more elongated openings (not shown), which allow for substrates to be transferred into and out of the thermal unit. Shutters may be provided to seal the one or more elongated openings.

Transfer shuttle 230 is operable to transfer substrates between the bake station 220, the chill plate 240, and a central robot (not shown). Some embodiments provide for the central robot to access the chill plate 240 directly, enabling loading and unloading of substrates at multiple positions inside the integrated thermal unit. In other embodiments, the transfer shuttle 230 takes the wafer off the pins above the chill plate, where it is deposited by the main robot, and moves it to the bake plate and back. In these embodiments, the transfers shuttle 230 is not necessarily accessible by the main robot. Generally, the transfer shuttle is able to move linearly along the length of the thermal unit and vertically within the thermal unit through activation of vertical actuator 250.

Generally, substrates enter the thermal unit by being placed on the transfer shuttle 230 after passing through an elongated opening corresponding to the position of the transfer shuttle 230 as illustrated in FIG. 2. Embodiments of the present invention are not limited to this transfer design as wafers may be transferred to and from the chamber by being placed on the pins above the chill plate. The shuttle delivers the substrate to the chill plate 240 and the bake station 220 as appropriate to the particular thermal processes being performed on the substrate. Lift pin slots 232A and 232B are provided in transfer shuttle 230 to enable lift pins supporting the wafer to pass through the body of the shuttle. The transfer shuttle is mounted on a vertical actuator 250, which enables the transfer shuttle to move vertically within the integrated thermal unit.

Bake station 220 contains a bake plate within a clam shell enclosure as discussed in more detail throughout the present specification, the bake plate may be a multi-zone heater plate adapted to provide controlled heating to various portions of a substrate mounted on the bake plate.

Embodiments of the present invention are utilized in temperature controlled processes performed utilizing bake plates used for post-application-bake (PAB) and/or post-exposure-bake (PEB) processes. Uses are not limited to these processes as the cooling of temperature control structures are included within the scope of embodiments of the present invention. These other temperature control structures include chill plates, develop plates, and the like. One of ordinary skill in the art would recognize many variations, modifications, and alternatives.

FIG. 3A is a top plan view of an example of a multi-zone bake plate that includes six different electrically independently heating zones according to an embodiment of the present invention. According to embodiments of the present invention, the bake plate 310 is utilized in the integrated thermal unit 210 illustrated in FIG. 2. As shown in FIG. 3A, bake plate 310 includes six independent heater zones $312_1$-$312_6$ along with a corresponding number of temperature sensors $314_1$-$314_6$, one for each of the heater zones $312_1$-$312_6$.

Depending on the particular application, various types of temperature sensors (e.g., resistance temperature detectors (RTDs)) may be utilized. A controller (not shown) is utilized in a feedback loop to provide control over the temperature of the various heater zones $312_1$-$312_6$. For example, in a specific embodiment, the bake plate 310 includes two or more insulating layers with a kapton layer sandwiched between the insulating layers. Metal traces formed into a patterned wiring layer are then used to resistively heat the various heater zones $312_1$-$312_6$. One of ordinary skill in the art would recognize many variations, modifications, and alternatives. Additional description of multi-zone heater plates is provided in U.S. patent application Ser. No. 11/483,832, filed on Jul. 7, 2006, commonly assigned and hereby incorporated by reference for all purposes.

Although the bake plate 310 illustrated in FIG. 3A only utilizes a single temperature sensor per zone, this is not required by embodiments of the present invention. In alternative embodiments, multiple temperature sensors may be utilized in one or more of the temperature zones. Additionally, although the bake plate 310 utilizes six temperature zones, this particular number of zones, along with the illustrated geometry, are not required by embodiments of the present invention. In other embodiments, the number of zones is increased or decreased, the spatial layout of the various zones is modified, and the like. One of ordinary skill in the art would recognize many variations, modifications, and alternatives.

Figure 4A:
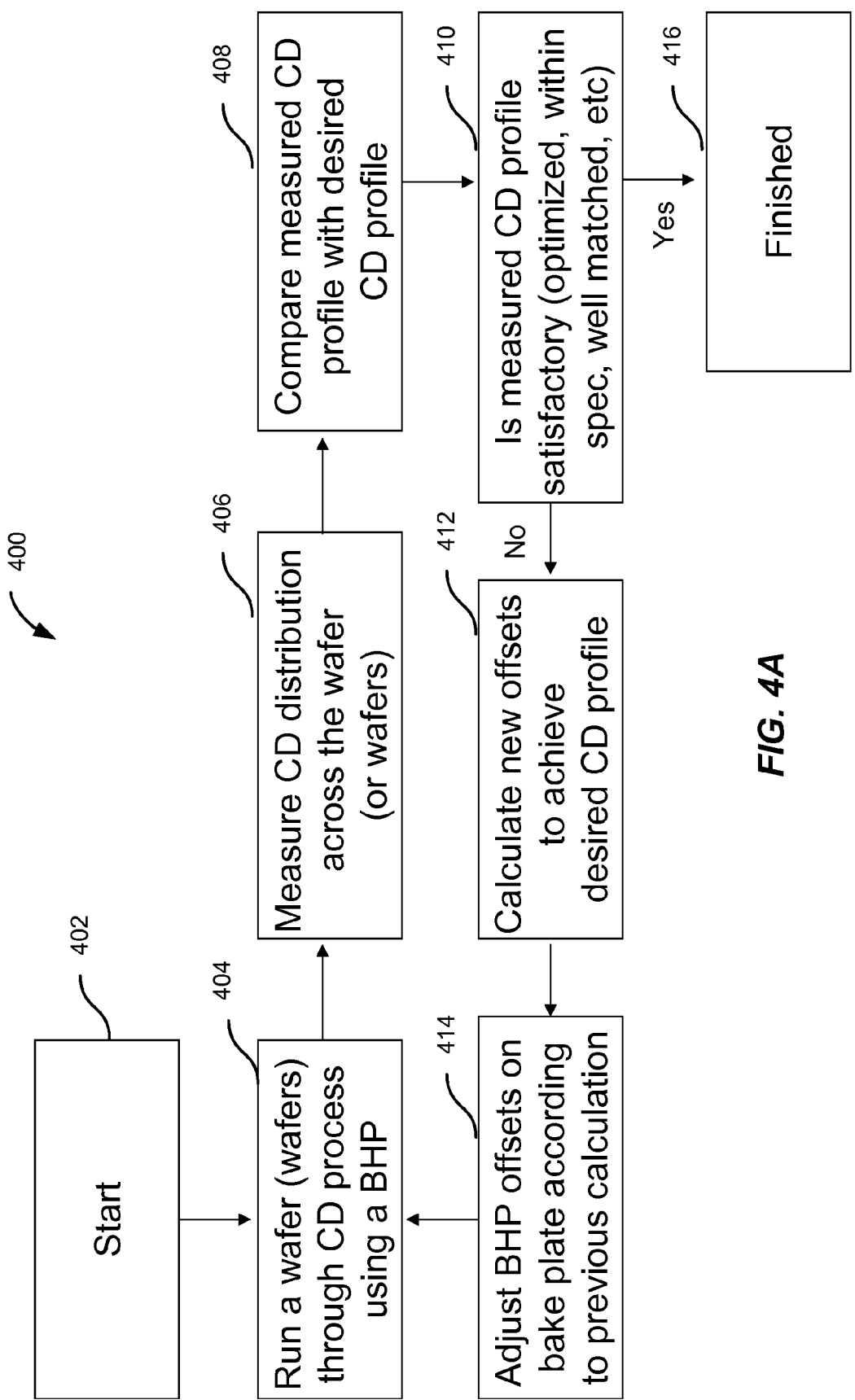
FIG. 4A is a simplified flowchart illustrating a method of controlling a wafer CD profile according to an embodiment of the present invention.

FIG. 4A is a simplified flowchart illustrating a method 400 of controlling a wafer CD profile according to an embodiment of the present invention. As illustrated in FIG. 4A, the method 400 begins at step 402. A wafer (or a set of wafers) is processed through a CD process using a multi-zone bake plate (BHP) in step 404. A metrology tool is then utilized to obtain a mapping of the CD distribution across the wafer in step 406. For example, the metrology tool may be a Nanometrics Atlas metrology tool available from Nanometrics, Inc. of Milpitas, Calif., a SpectraCD 200 from KLA-Tencor Corp. of San Jose, Calif., or other suitable metrology tools. It should be noted that the CD map obtained in step 406 may be obtained after lithographic processes are performed on the wafer or after other processing steps including etch, deposition, anneal, and the like.

The number of CD data points included in the wafer CD map will generally depend on the particular operational parameters selected for the metrology tool. Generally, these particular operational parameters are foundry dependent. For example, since the throughput of the metrology tool will generally be inversely proportional to the number of CD data points collected, higher throughput implementations will provide a reduced number of CD data points. In some embodiments, the number of CD data points is greater than or equal to the number of heater zones provided by the multi-zone bake plate. Thus, some embodiments will provide 6, 29, 66, more, or less CD data points.

As will be evident to one of skill in the art, the density with which the CD data points are collected will impact the correlation between the CD data points (measurement points) and the zone geometry of the multi-zone bake plate. In some implementations, the CD data points are collected in a grid configuration with a predetermined distance between each point, for example, about 20-30 mm. This distance may be varied as a function of position, providing an increased or decreased density at the wafer center, edge, or the like, as appropriate to the particular application.

Depending on the geometry of the multi-zone heater plate, the number of measurement points per heater zone and the position of the various measurement points in each of the various heater zones will vary. Thus, when the CD data points are correlated to the heater zone geometry, one or more CD data points will be assigned to each of the heater zones. Typically, several measurement points will be assigned to each heater zone, with the various assigned measurement points distributed at various locations across each heater zone.

The CD data points are averaged in some embodiments to compute an average CD value for each of the heater zones. This average may be computed by considering each of the CD data points in the particular heater zone or may be a weighted average as described more fully below. Moreover, a subset of the CD data points may be utilized in computing the zone average in some embodiments if appropriate to the particular application. Thus, the density of measurement points may be varied or modified in comparison with the original density associated with the CD measurement process. Generally, it is preferable to have a higher data density in smaller heater zones, such as the four heater zones $312_3$-$312_6$ located at the periphery of the bake plate illustrated in FIG. 3A.

Merely by way of example, in a particular metrology process, which could be optical CD (OCD), CD measured using a scanning electron microscope (CD-SEM), or the like, 60 CD data points are measured. These 60 measurements are distributed uniformly over the surface of the semiconductor wafer in a grid pattern. For the multi-zone bake plate illustrated in FIG. 3A, there will be approximately ten measurement points in heater zone $312_1$, approximately 30 measurement points in heater zone $312_2$, and approximately five measurement points in heater zones $312_3$-$312_6$.

The method also includes comparing the measured CD profile with a desired CD profile (408). If the measured CD profile is within predetermined limits or otherwise satisfactory (410), then the CD control process is terminated at step 416. The determination of a satisfactory CD profile may include a comparison with a predetermined specification (spec) or other criteria.

If the measured CD profile is not satisfactory, then offsets are calculated between the measured CD profile and the desired CD profile in step 412. Additional discussion of how the offsets are computed in step 412 is provided throughout the present specification and more particularly below. Based on the computed offsets, the temperature of the various heater zones in the multi-zone bake plate are modified to provide different temperatures in the various heater zones. Modifications of the temperature in one zone will typically impact not only the CD of the modified zone, but the CD of other zones as well as a result of cross-talk between heater zones, among other factors. Thus, as illustrated in FIG. 4A, an iterative process is utilized, repeating one or more steps of the process 400 multiple times until the measured CD as a function of wafer position matches the target CD profile within a predetermined tolerance or is otherwise satisfactory.

In order to determine the amount of temperature modification appropriate for each heater zone in step 414, a temperature sensitivity profile for the particular photoresist used in the lithography process (e.g., the slope of a plot of CD vs. temperature) is utilized.

Figure 5A:
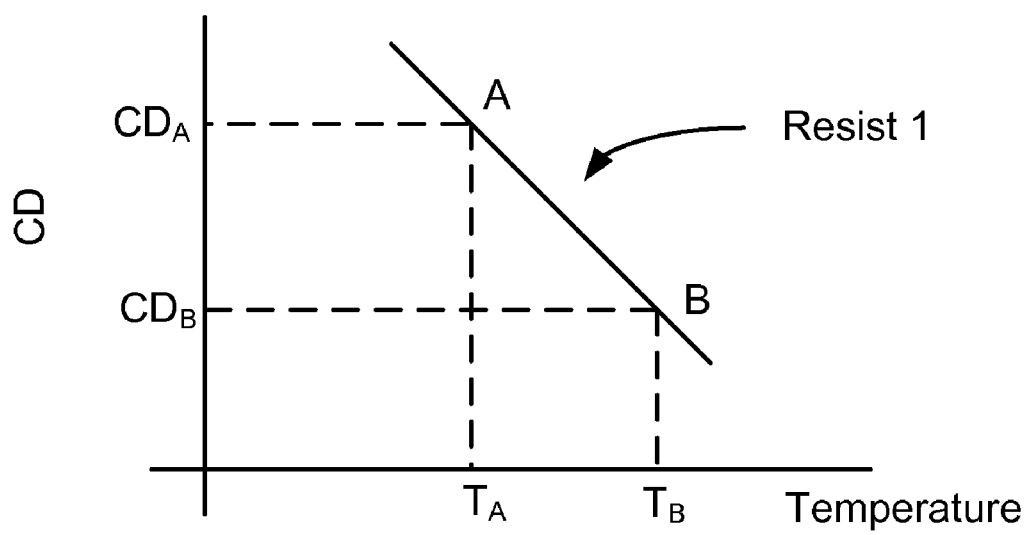
FIG. 5A is a simplified plot of temperature sensitivity for a first exemplary photoresist, Resist 1.
Figure 5B:
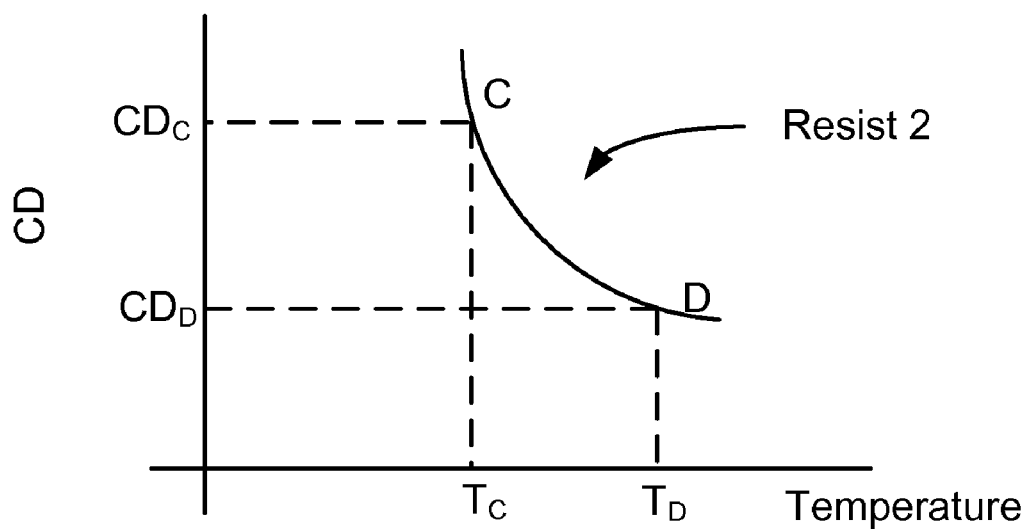
FIG. 5B is a simplified plot of temperature sensitivity for a second exemplary photoresist, Resist 2.

FIG. 5A is a simplified plot of temperature sensitivity for a first exemplary photoresist, Resist 1. As shown in the plot, the CD vs. temperature curve is generally linear for Resist 1. If the target CD is value B and the measured average CD for a heater zone is value A, then the temperature of the heater zone is increased from temperature $T_A$ to temperature $T_B$. Thus, using a plot similar to the temperature sensitivity profile illustrated in FIG. 5A, the $\Delta$CD for each heater zone is translated into a $\Delta$T for each heater zone. FIG. 5B is a simplified plot of temperature sensitivity for a second exemplary photoresist, Resist 2. As illustrated in FIG. 5B, it is not necessary that the resist temperature sensitivity is linear. In some embodiments, the resist temperature sensitivity is modeled using polynomial fitting or other modeling techniques. One of ordinary skill in the art would recognize many variations, modifications, and alternatives.

Returning to step 412 illustrated in FIG. 4A, the computation of CD offsets may be performed in various manners. As discussed above, the CD values overlying each heater zone may be averaged to provide a simple average CD for each heater zone. Additionally, weighted averages may be computed using CD measurements for points that lie in a heater zone plus adjacent zones. In a particular implementation, the weights can be applied to points in a particular heater zone and/or points that lie in adjacent zones.

Figure 3B:
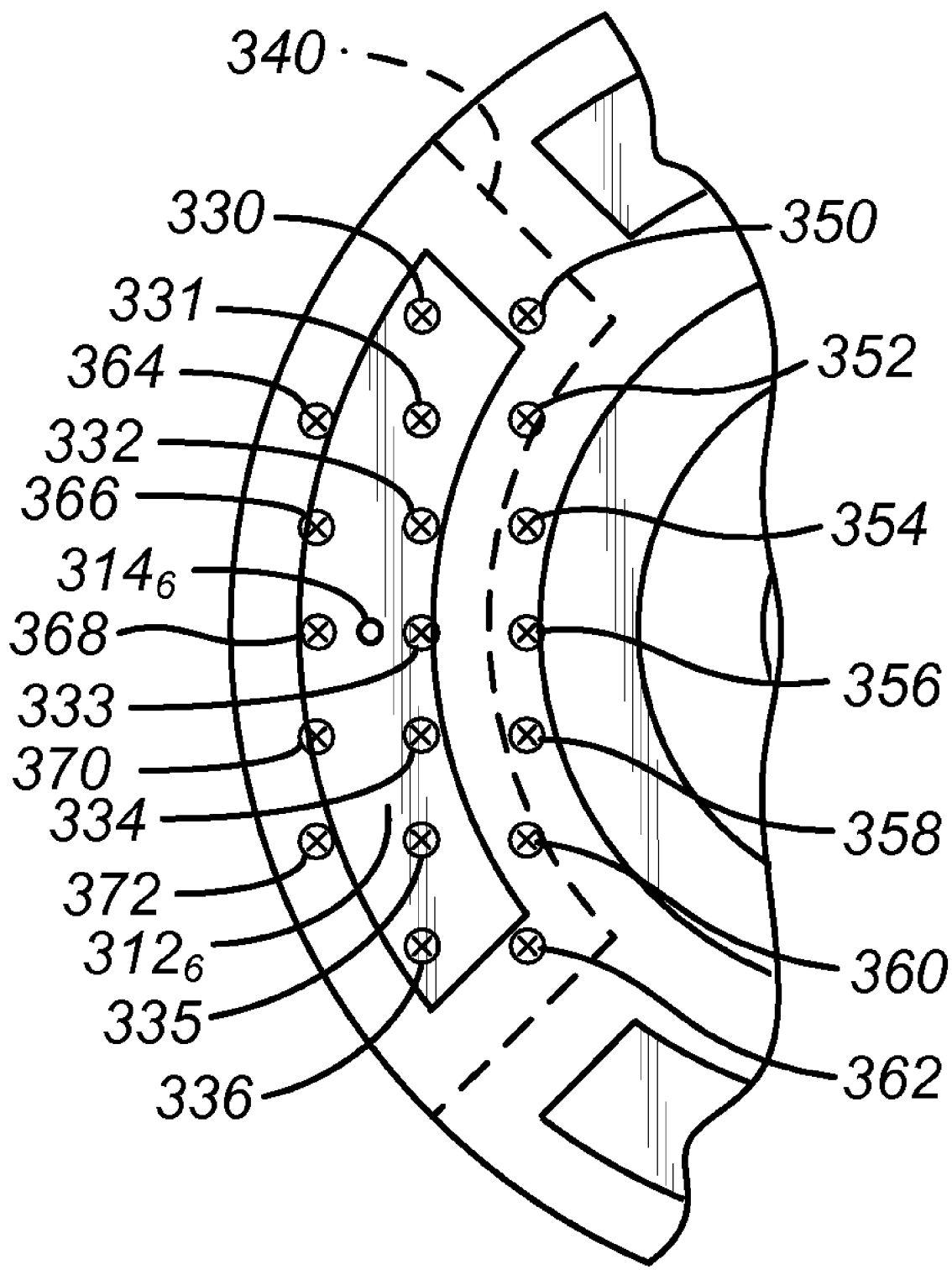
FIG. 3B is a simplified illustration of a portion of a multi-zone heater plate illustrating the computation of a weighted average used in a particular embodiment of the present invention.

FIG. 3B is a simplified illustration of a portion of a multi-zone heater plate illustrating the computation of a weighted average used in a particular embodiment of the present invention. As illustrated in FIG. 3B, a portion of the multi-zone bake plate illustrated in FIG. 3A is overlaid with a number of CD measurement points. For purposes of clarity, not all the measurement points are illustrated. In a particular embodiment, the measurement points falling within a boundary region 340 to heater zone 312$_6$ are utilized in determining a weighted CD average for the heater zone 312$_6$. Ten of the measurement points, that is, measurement points 330-336 and 366-370, overlie the heater zone 312$_6$.

Other measurement points, for example, the six measurement points 350, 352, 360, 362, 364, and 372 ("boundary points") lie outside the heater zone of interest, but within boundary region 340. Although these boundary points are not overlying the heater zone, it may be desirable to include the CD values associated with these boundary points in computing the "average" CD for heater zone 312$_6$. Thus, the CD values associated with these six boundary points are weighted (i.e., a weight less than or equal to one) to include their contribution to the zone average. The weightings may be equal or may be different depending on several factors including the distance of each of the points from the zone center or the zone edge, the proximity of the points to adjacent heater zones, and the like. Some measurement points, for example, 354 and 358 lie on the edge of the boundary zone. These values may be weighted or ignored depending on the particular algorithm selected. In the following example, they are ignored, although this is not required. Finally, some points, such as measurement point 356 are outside the boundary zone and are ignored in this particular embodiment.

As an example, a weighted average is computed for the heater zone using the following algorithm in which an equal weight w is given to all boundary points:

$$\overline{CD}_{312_6} = \frac{\left(\sum (330 \ldots 336) + \sum (366 \ldots 370)\right) + w(350 + 352 + 360 + 362 + 364 + 372)}{10 + 6w},$$

where the value 10 in the denominator is equal to the number of measurement points overlying the heater zone 312$_6$ and the value 6 is equal to the number of measurement points classified as boundary points. Of course, other weights can be applied to the measurement values depending on the particular implementation. In the algorithm above, the points lying outside the boundary zone 340 were ignored, but this is not required by the present invention. Such points could be weighted as well and then included in the computation.

As will be evident to one of skill in the art, the example above, in which the boundary zone points are weighted, can be extended to a computation including additional CD measurement points, regardless of their position on the wafer. In this way, the effects of one heater zone on another heater zone (i.e., crosstalk between heater zones) can be accounted for in determining the CD profile for the multi-zone bake plate. Merely by way of example, a 6×6 matrix relating the change in each heater zone to every other heater zone could be used for a six-zone bake plate. As an example, in this matrix-based computation, if the temperature of a first zone is raised by 0.5° C., the temperature of an adjacent zone could increase by 0.2° C. and the temperature of a zone on the opposite side of the bake plate could decrease by 0.03° C., and the like. Of course, the actual values would be determined empirically, by calculations, or a combination thereof.

Moreover, a physical model of the plate could be utilized in which a calculation is performed to determine the temperature at every CD point on the plate as a function of the offsets and use the computed temperature to calculate the probable CD. Then an optimization technique would be used to minimize the sum of squares difference between the predicted CD and desired CD to find the optimal predicted offsets. In such a model, the offsets could be adjustable parameters. Additionally, more complicated models are included within embodiments of the present invention in addition to a sum of squares minimization across the plate. One of ordinary skill in the art would recognize many variations, modifications, and alternatives.

It should be appreciated that the specific steps illustrated in FIG. 4A provide a particular method of obtaining a desired CD profile according to an embodiment of the present invention. Other sequences of steps may also be performed according to alternative embodiments. For example, alternative embodiments of the present invention may perform the steps outlined above in a different order. Moreover, the individual steps illustrated in FIG. 4A may include multiple sub-steps that may be performed in various sequences as appropriate to the individual step. Furthermore, additional steps may be added or removed depending on the particular applications. One of ordinary skill in the art would recognize many variations, modifications, and alternatives.

In an alternative embodiment, another method of controlling CD is provided. The method 430, which is illustrated in the simplified flowchart of FIG. 4B, includes the following steps:

1) Obtain a wafer CD map including a number of CD data points (432). The CD wafer map may be obtained using one of several available metrology tools as described above;

2) Correlate the CD data points (e.g., 66 CD data points per wafer) with the heater plate zone geometry (434);

3) Assign at least one CD data point to each zone of the heater plate (436);

4) Compare the measured CD values for one or more of the heater zones to a target CD for the heater zone, providing a ΔCD for one or more of the heater zones (438). In a particular embodiment, comparing the measured CD values includes calculating an average CD value for the various heater zones as described above and comparing these values to target CD values for each heater zone to produce a CD offset. As discussed above, the average values may be simple averages, weighted averages for adjacent or all zones, or the like;

5) Modify the temperature of one or more of the heater zones based on the computed CD offset (440); and 6) Optionally repeat steps (1) through (5) one or more times (e.g., 3-5 times) (442). According to some embodiments of the present invention, the CD uniformity as a function of wafer position can be iteratively controlled utilizing the method illustrated in FIG. 4B. For example, step 442 could include determining if the ΔCD for one or more heater zones is less than a predetermined threshold value.

Although some embodiments utilize a linear function for the CD as a function of temperature, this is not required by embodiments of the present invention. Other functional relationships are provided herein including polynomial fits or other models that relate the change in CD to the temperature or other process parameters. Thus, in step 438, although a difference is illustrated, the computation could include a differential calculation or other fitting routine as appropriate to the particular process utilized. One of ordinary skill in the art would recognize many variations, modifications, and alternatives.

Figure 4B:
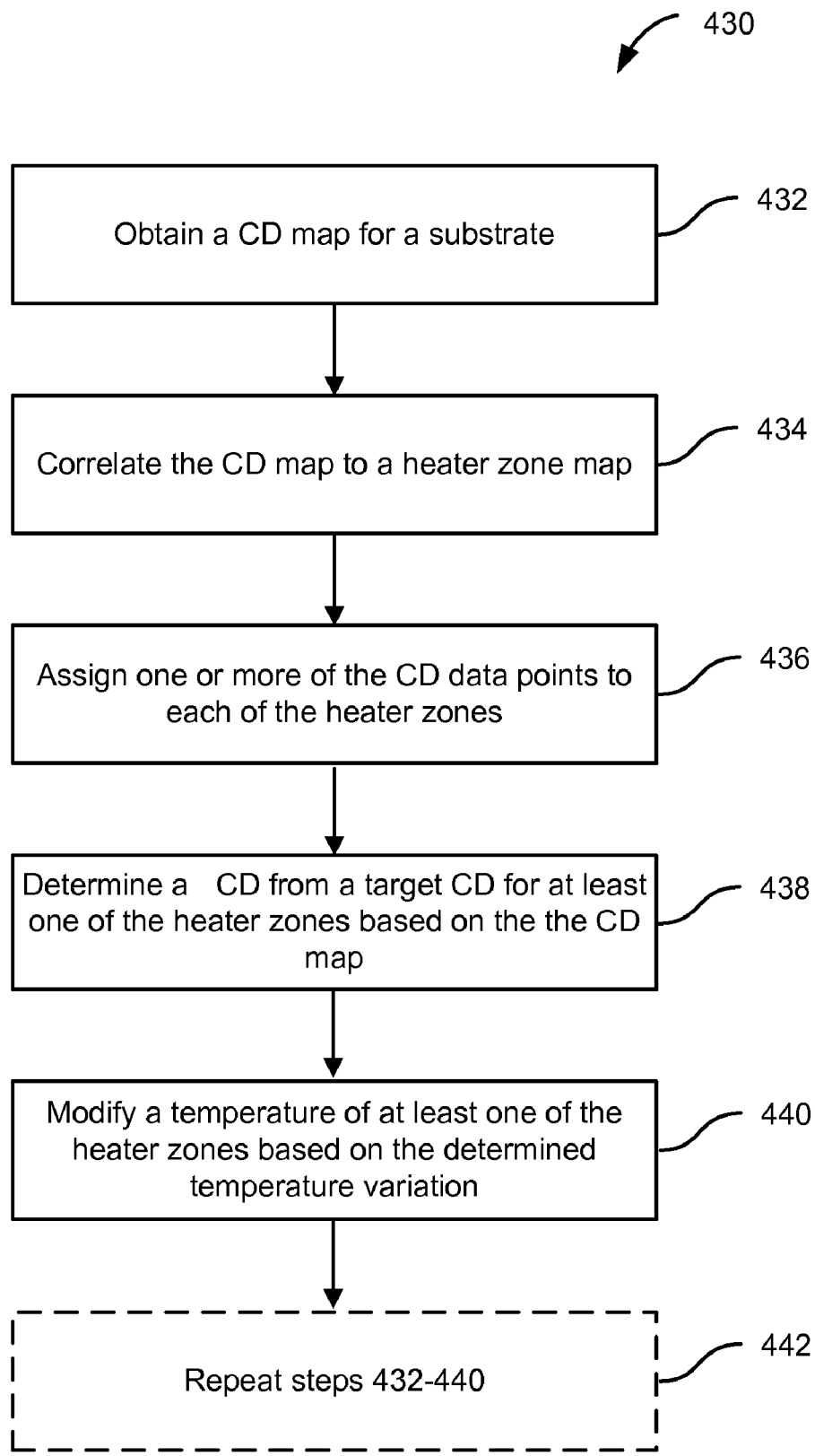
FIG. 4B is a simplified flowchart illustrating another method of controlling CD according to an embodiment of the present invention.

It should be appreciated that the specific steps illustrated in FIG. 4B provide a particular method of controlling CD to achieve a measured CD profile within a predetermined tolerance of a target CD profile according to an embodiment of the present invention. Other sequences of steps may also be performed according to alternative embodiments. For example, alternative embodiments of the present invention may perform the steps outlined above in a different order. Moreover, the individual steps illustrated in FIG. 4B may include multiple sub-steps that may be performed in various sequences as appropriate to the individual step. Furthermore, additional steps may be added or removed depending on the particular applications. One of ordinary skill in the art would recognize many variations, modifications, and alternatives.

Utilizing the techniques provided by embodiments of the present invention, the CD non-uniformity is reduced or minimized as a function of wafer position. Generally one or more calibration wafers are processed in advance of a wafer lot. Accordingly, the calibration wafers are utilized to calibrate the system and determine the minimum CD non-uniformity. Additionally, techniques provided by embodiments of the present invention may be used in-situ as part of a process control algorithm (e.g., automatic process control (APC)) and the like.

Embodiments of the present invention provide algorithms utilized in tuning critical dimension (CD) control for particular semiconductor processes. As an example, the temperature profile of a bake plate may be controlled and tuned to minimize CD non-uniformity as a function of wafer position. In another embodiment, the CD tuning algorithm includes the following steps:

1) Measure a wafer CD profile;
2) Obtain a wafer temperature map;
3) Measure $$\frac{d(CD)}{dT};$$

4) Determine the heater zone settings; and
5) Perform other steps as necessary.

In an embodiment, the wafer temperature map is obtained using a measurement wafer such as a SensArray Process Probe® instrumented substrate available from SensArray Corporation of Santa Clara, Calif., a BakeTemp SensorWafer available from Onwafer Technologies of Santa Clara, Calif., or a similar device, to obtain a temperature map of the wafer to be processed. In step 3, the change in the CD as a function of temperature is measured. The $$\frac{d(CD)}{dT}$$

may be measured as a function of position, providing a multi-variable function. The functional relationship between the CD and the temperature may, in general, be a non-linear function and may be modeled using various modeling techniques known to one of skill in the art.

In a system using a scatterometer, the optical change in the scatterometry profile based on a temperature change is used to study reaction processes performed on the wafer. The heater zone settings are determined based, in part, on the results of the $$\frac{d(CD)}{dT}$$

measurements.

In other embodiments, rather than minimizing the CD non-uniformity as a function of wafer position, the techniques provided herein are utilized to achieve a predetermined CD profile as a function of wafer position. Merely by way of example, it may be desirable to provide a CD profile that decreases as a function of wafer radius. In this embodiment, the CD as a function of wafer radius could be analyzed and the difference between the measured CD and the desired CD as a function of wafer radius could be minimized. Of course, other functional relationships between CD and position could be provided utilizing embodiments the present invention.

Some embodiments of the present invention are utilized to calibrate a bake plate or optimize a bake plate temperature profile. In this embodiment, a measurement wafer or other temperature measuring device (e.g., a SensArray Process Probe® instrumented substrate as described above) is used to measure the bake plate temperature as a function of the bake plate geometry. A computation is performed to determine temperature differences between measured temperatures and target temperatures as a function of the bake plate geometry. The heater zones of the bake plates are then adjusted in response to the determined temperature differences. The process is repeated until the bake plate temperature as a function of position is within predetermined tolerances.

The steps of this bake plate calibration process may be performed as follows:

1) Determine wafer CD profile;
2) Place a measurement wafer on the multi-zone bake plate;
3) Measure the bake plate temperature profile as a function of position;
4) Compute $T_{measured}$-$T_{target}$ as a function of position (i.e., $\Delta T(position)$);
5) Compute $CD_{measured}$-$CD_{target}$ as a function of position (i.e., $\Delta CD(position)$);
6) Adjust the heater zone settings in response to the computed temperature differences;
7) Determine if $\Delta T(position)$ is less than a predetermined tolerance; and
8) Repeat steps 2)-5) until $\Delta T(position)$ is less than the predetermined tolerance.

As an example, another CD-tuning process is described. A measurement wafer or other temperature measuring device is utilized to provide a wafer temperature map including the mean temperature of the wafer as well as temperatures as a function of position. The temperatures as a function of position are related to the temperatures of the various zones in the heater plate. After a semiconductor process is performed, for example, development, the CD of the wafer is measured, using a tool that is located either in the track lithography tool (integrated metrology) or external to the track lithography tool (stand-alone metrology). For each heater zone, the corresponding wafer zones are measured to provide a mean CD as well as CD values for each zone. Thus, for each zone, a mean temperature and a mean CD are provided.

The temperature of a zone is varied and the measurement processes are repeated to provide a measurement of the $$\frac{\Delta(CD)}{\Delta T}.$$

Multiple measurements are made as a function of zone temperatures to provide a mapping of $$\frac{d(CD)}{dT}.$$

As will be evident, there is an interaction between zones, so a matrix is developed for the $$\frac{d(CD)}{dT}$$

measurements, varying first one zone to provide a one dimensional column and then another zone is varied, then both. One of ordinary skill in the art would recognize many variations, modifications, and alternatives. Once the matrix of $$\frac{d(CD)}{dT}$$

measurements is obtained, to achieve a desired CD, the temperature of the heater zones is set to achieve the desired CD.

It should be appreciated that the specific steps illustrated above provide a particular method of performing CD-tuning according to an embodiment of the present invention. Other sequence of steps may also be performed according to alternative embodiments. For example, alternative embodiments of the present invention may perform the steps outlined above in a different order. Moreover, the individual steps illustrated above may include multiple sub-steps that may be performed in various sequences as appropriate to the individual step. Furthermore, additional steps may be added or removed depending on the particular applications. One of ordinary skill in the art would recognize many variations, modifications, and alternatives.

The CD-tuning algorithm discussed above may also be used to optimize one or more processes utilized during the lithographic processing of a semiconductor wafer. These processes include, without limitation, a bake process, a develop process, a photoresist coat or other coating process, a deposition process, or the like. In a bake process, a method provided according to an embodiment of the present invention includes the following steps:

1) Measure a wafer profile
2) Obtain a wafer temperature map
3) Measure $$\frac{d(CD)}{dT}$$

4) Determine the heater zone settings
5) Perform the bake process
6) Measure the wafer CD
7) Optimize the heater zone settings
8) Perform other steps as necessary It should be appreciated that the specific steps illustrated above provide a particular method of performing CD-tuning for lithographic processes according to an embodiment of the present invention. Other sequence of steps may also be performed according to alternative embodiments. For example, alternative embodiments of the present invention may perform the steps outlined above in a different order. Moreover, the individual steps illustrated above may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 6:
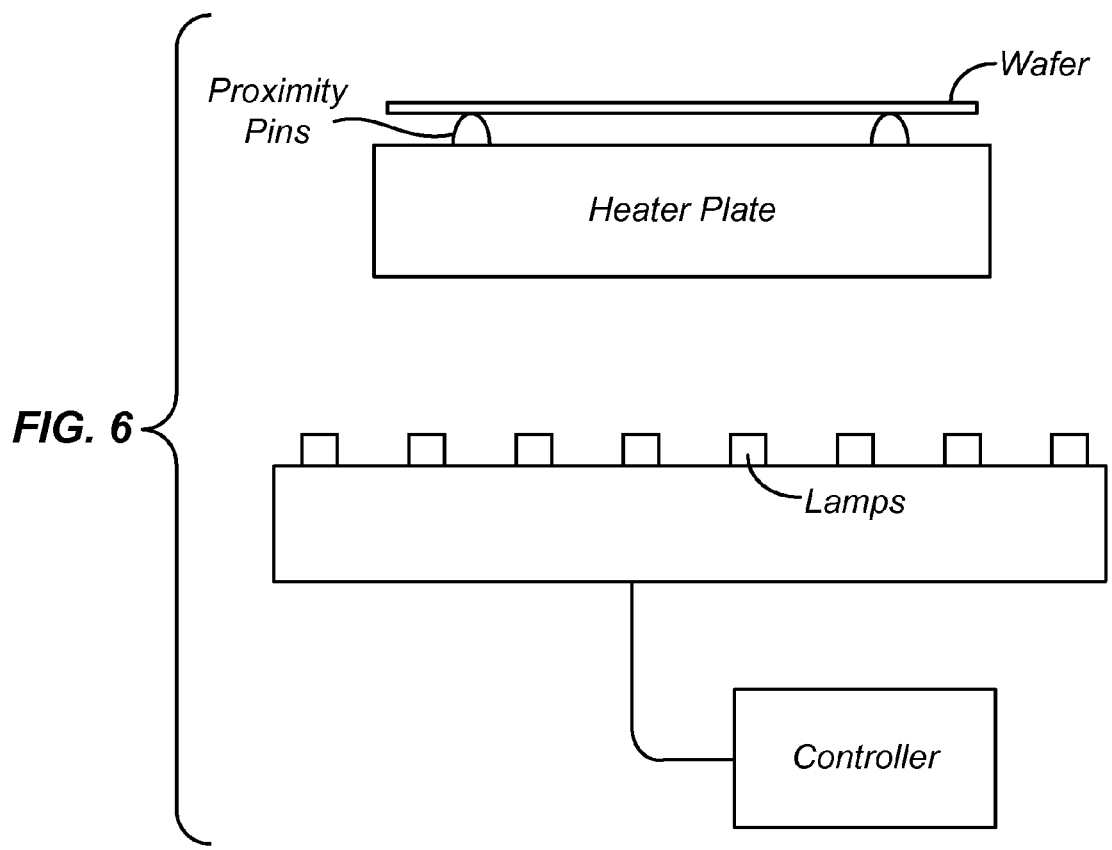
FIG. 6 is a simplified cross-sectional view of a multi-zone heater plate according to an embodiment of the present invention.

FIG. 6 is a simplified cross-sectional view of a multi-zone heater plate according to an embodiment of the present invention. As shown in FIG. 6, a number of radiant lamps are utilized to provide spatially independent heater zones. The lamps, which may emit infrared or other wavelengths of radiation, may be arrayed in a two-dimensional pattern in the plane normally aligned with the substrate. As illustrated, the heater plate, which may be made of quartz or other suitable material adapted to absorb radiation emitted by the lamps, supports a wafer using proximity pins. Chucking mechanisms including vacuum chucks and E-chucks may be utilized as appropriate to the particular applications.

A controller is utilized in a feedback loop (not shown) to vary the intensity of the individual lamps, thereby providing a spatially varying heat load to the heater plate. In some embodiments, a computer (not shown) interacts with sensors (not shown) measuring the temperature of the wafer or substrate to provide inputs to the controller. Utilizing the lamps as pixels, a two-dimensional intensity pattern can be generated on the heater plate, resulting in a number of controllable zones. In combination with the heater plate designs discussed above, including segmented heater elements, the thermal conductivity of the plate in the lateral direction can be combined with radiant heating illustrated in FIG. 1 to provide additional control over the temperature profile of the heater plate.

Figure 7:
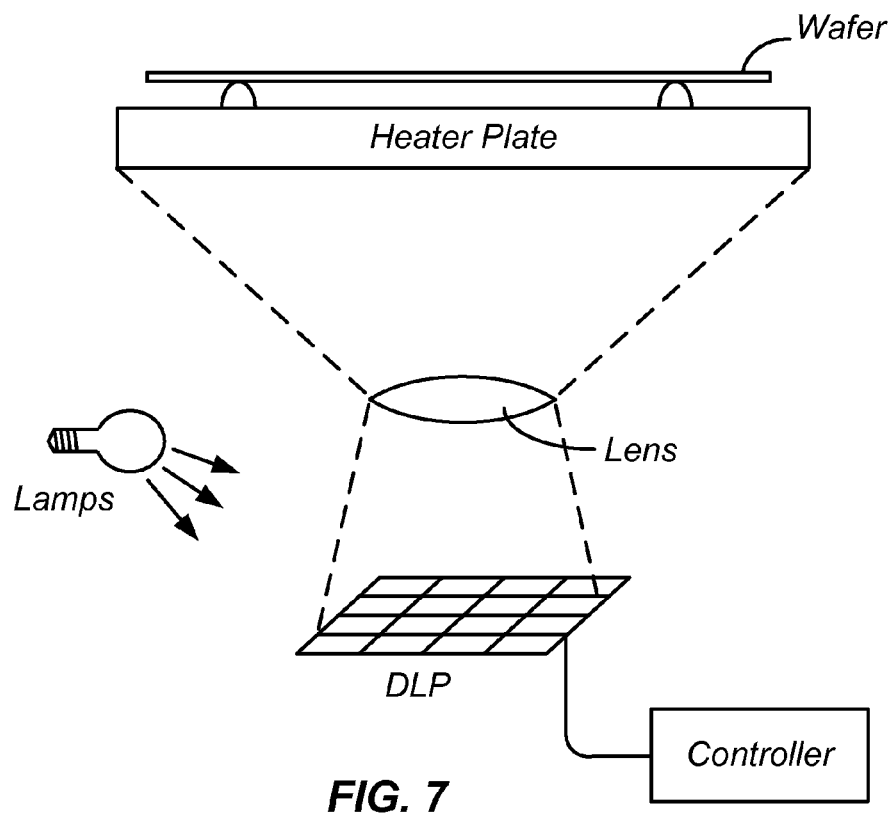
FIG. 7 is a simplified cross-sectional view of a multi-zone heater plate according to another embodiment of the present invention.

FIG. 7 is a simplified cross-sectional view of a multi-zone heater plate according to another embodiment of the present invention. As illustrated in FIG. 7, a spatial light modulator, for example, a digital micro-mirror device is utilized to spatially vary the intensity of radiant energy at the heater plate.

A radiant source, such as an infrared lamp, is utilized to provide radiation to the spatial light modulator. In the embodiment illustrated in FIG. 7, a digital light projector (DLP) is utilized to create a pixel-based image on the backside of the heater plate. A controller is utilized, generally in a feedback loop (not shown), to control the DLP array. Utilizing the embodiment of the present invention illustrated by FIG. 7, a two-dimensional intensity pattern is provided at the surface of the heater plate, resulting in a spatially varying temperature profile on the wafer.

In an embodiment, the heater plate includes a resistive heating element in addition to materials that absorb the radiant heat provided by the lamp and directed to the heater plate using the DLP. Thus, control of the heater plate temperature profile is provided by both electrical heaters and radiant heating elements. The combination of radiant and resistive heating provides a design in which the thickness of the heater plate may be reduced in comparison with conventional heater plates.

In a particular embodiment, tuning of the temperature profile is performed using the DLP pixel-based radiation once the resistive heating elements, which may be arranged in a segmented design, have brought the heater plate to an operating temperature. The pixel-based control provided by the embodiment illustrated in FIG. 7 may be combined with heater designs as discussed above. One of ordinary skill in the art would recognize many variations, modifications, and alternatives.

An adjustable heat loss mechanism may be physically attached to the heater plate (e.g., a bake plate) to spatially vary the heat loss of the heater plate. As an example, a number of independently controllable networks of copper tubing containing a fluid (e.g., water, oil, and the like) may be used to vary the heat loss spatially.

According to another embodiment of the present invention, methods and systems for controlling the gap between the wafer and pedestal are utilized to provide thermal control in track lithography tool applications. These methods and systems include the use of an electrostatic chuck (E-chuck). Additional description of E-chucks are provided in U.S. Patent Application Publication No. 2006/0238954, published on Oct. 26, 2006, and entitled "Electrostatic Chuck for Track Thermal Plates," which is incorporated herein by reference in its entirety for all purposes. It should be noted that the use of an E-Chuck will result in flattening of the wafer against the chuck or pedestal surface, resulting in reductions in the non-uniformity of the gap between the wafer and the pedestal.

In another embodiment, physically separated heater zones (e.g., in an annular configuration, in a quadrant-based configuration, and the like) provide for independently adjustable height of the pedestal sections. Accordingly, the gap between portions of the wafer and the pedestal can be varied by modifying the height of the individual pedestal sections.

In yet another embodiment, the backside gas pressure is varied spatially to maintain a controllable gap between wafer and pedestal. Generally, the backside gas provides a conductive medium that conducts heat between the pedestal and the wafer. In a specific embodiment, the gas pressure is reduced in a selected portion of the pedestal in order to result in a smaller gap between the wafer and the pedestal. Alternatively, the gas pressure is locally increased to locally increase the gap between the wafer and the pedestal. Combining variations in the backside gas pressure with a thinner heater is utilized in some embodiments.

Figure 8:
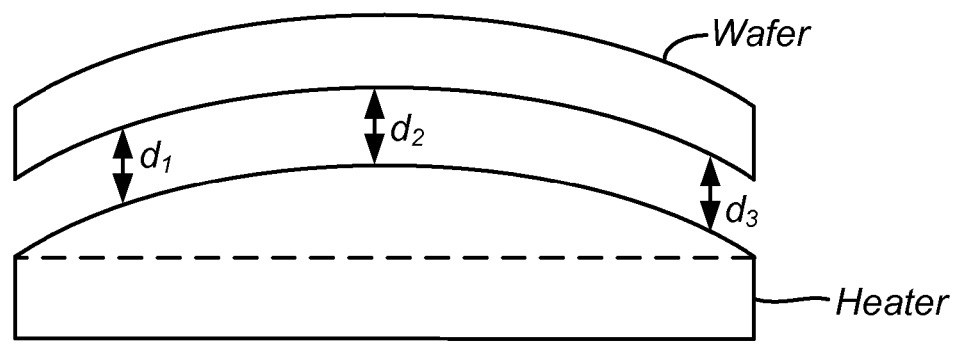
FIG. 8 is a simplified schematic diagram illustrating an adaptive heater surface according to an embodiment of the present invention.

FIG. 8 is a simplified schematic diagram illustrating an adaptive heater surface according to an embodiment of the present invention. In the embodiment illustrated in FIG. 3, the surface of the heater is bowed in an upward direction at the center of the pedestal. Of course, in other embodiments, the bow is downward at the center or varied across the surface of the pedestal, locally bowed up at some locations, locally bowed down at other locations, and unchanged at still other locations. In a particular embodiment, the variations of the wafer from flatness are measured and a variable bow is introduced into the pedestal, matching the variations in the wafer. Accordingly, the gap between the wafer and the heater is substantially constant as a function of position (i.e., $d_1 \approx d_2 \approx d_3$).

Figure 9:
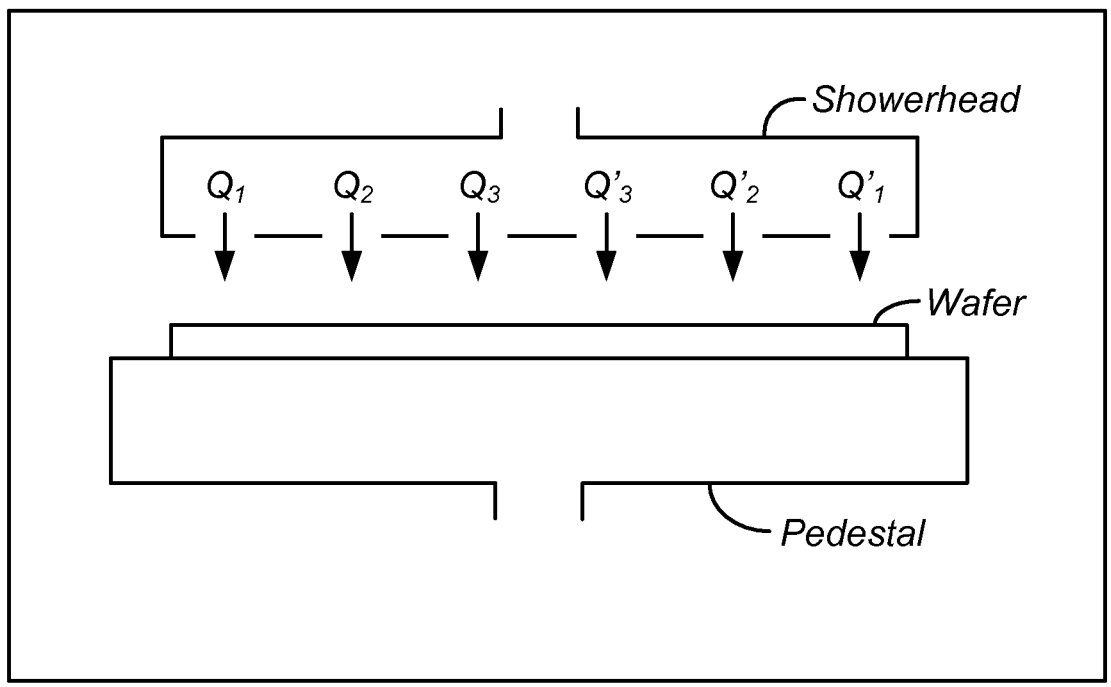
FIG. 9 is a simplified schematic diagram of an apparatus for introducing a heated gas into a bake chamber according to an embodiment of the present invention.

Embodiments of the present invention provide methods and systems for heating wafers in modules of a track lithography tool. FIG. 9 is a simplified schematic diagram of an apparatus for introducing a heated gas into a bake chamber according to an embodiment of the present invention. As illustrated in FIG. 9, a showerhead is provided with a number of orifices on a face opposite the wafer. A heated gas, for example, nitrogen, is dispensed into the chamber through the orifices in the showerhead. The flow rates of the heated gas are represented in FIG. 9 by symbols $Q_1$, $Q_2$, $Q_3$ and $Q_1'$, $Q_2'$, and $Q_3'$. In a specific embodiment, the flow rates are symmetric (i.e., $Q_1 = Q_1'$) although this is not required by the present invention. In some embodiments, the flow rates are controllable so that the flow rate varies as a function of radius. Accordingly, a reduced flow of the heated gas is provided at portions of the substrate that are at a higher temperature. In a particular embodiment, the radial control of the flow rates provides for uniform evaporation from the substrate as a function of position.

Embodiments of the present invention provide for combinations of heating the pedestal and flow of heated gas through the shower head. Additionally, combinations of various methods and systems as described more fully throughout the specification are provided according to embodiments of the present invention.

In addition to a showerhead above the wafer surface, a heated showerhead with fluids jets can be used on the underside of the pedestal. The gap between the top of the wafer and the heated showerhead can be varied to control heating rate and uniformity. One of ordinary skill in the art would recognize many variations, modifications, and alternatives.

Embodiments of the present invention utilize conduction processes to provide thermal control on track lithography tools. As an example, in an embodiment, a gas is introduced to the backside of a wafer for purposes of heating the wafer. In a specific embodiment, porous plugs passing through the substrate are utilized to provide a heating and/or a cooling gas to the backside of the substrate. The number, positioning, dimensions, and the like, of the porous plugs are selected to provide controllable distribution of backside gas. In a particular embodiment, the distribution of backside gas is uniform as a function of position, whereas in other embodiments, the distribution varies as appropriate to the particular application. In another embodiment, channels are provided in the pedestal to allow for uniformed distribution of backside gas. Embodiments of the present invention provide for both gas flow towards the wafer surface as well as away from the wafer surface utilizing either the porous plugs or the channels described above.

Another embodiment of the present invention utilizes a heater plate including an array of "thermal pixels." Additional description of thermal pixels is provided in U.S. Patent Application Publication No. 2007/0000441, published on Jan. 4, 2007, entitled "Scalable Uniform Thermal Plate," and incorporated by reference herein in its entirety for all purposes.

In an embodiment, radiation is used to heat the wafer and the emissivity of the wafer surface is modified to ensure uniform heating as a function of position. In other embodiments, heating is varied as a function of position, for example, to result in uniform heating of a wafer that is bowed.

In an embodiment, an array of fuel cells thermally coupled to the backside of the pedestal are utilized for purposes of pedestal heating. For example, a fuel cell consuming hydrogen and oxygen to produce water will produce heat useful for pedestal heating. The flow rates of the materials provided to the fuel cell can be controlled to achieve desired heat production and associated pedestal heating. The sizes, positioning, and the like, of the fuel cells are selected in some embodiments to provide uniform heating as a function of pedestal position. A benefit provided by an array of fuel cells is fast response time.

Embodiments of the present invention provide several methods and systems for quenching a wafer. Generally, it is desirable to provide both fast and uniform quenching of the wafer temperature during some semiconductor processes. For example, an adjustable heat loss mechanism may be attached to the underside of the heater to provide for wafer quenching. Merely by way of example, copper tubing or other thermally conductive materials may be provided in thermal contact with the pedestal to quickly cool the heated pedestal. In another embodiment, air flow is directed at fins attached to underside of pedestal to provide a quenching action.

Figure 10A:
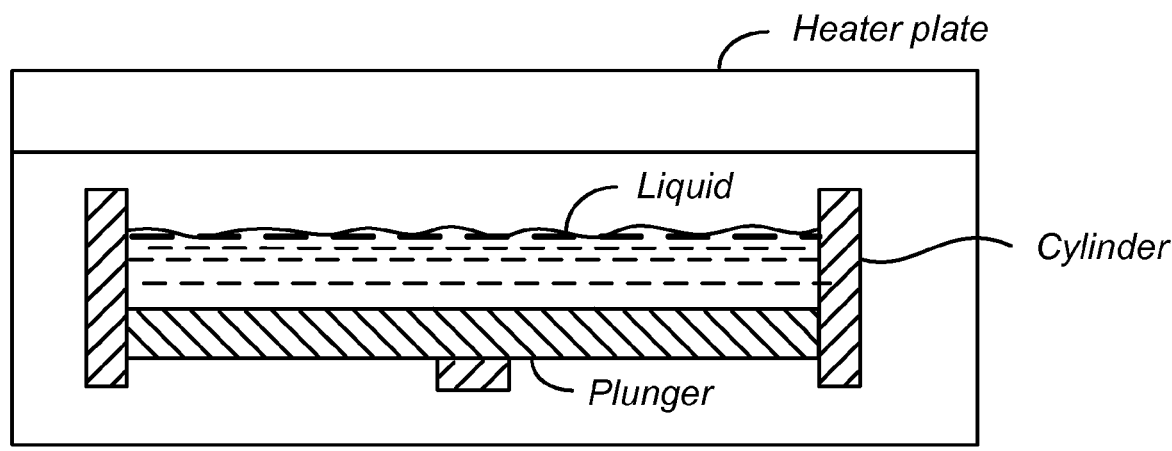
FIG. 10A is a simplified schematic diagram illustrating a vessel coupled to a pedestal at a first position according to an embodiment of the present invention.

Moreover, the use of a vessel coupled to underside of the pedestal and filled with a heat transfer fluid (e.g. "Galden") may be used for quenching. In a specific embodiment, the vessel is directly attached to the underside of the pedestal. FIG. 10A is a simplified schematic diagram illustrating a vessel coupled to a pedestal at a first position according to an embodiment of the present invention. As illustrated in FIG. 10A, a heat transfer fluid is supported in a cylinder with a plunger forming the bottom of the cylinder. The plunger is a cooled plate in contact with a chiller (not shown). In another embodiment, the bottom of the vessel contains a cold plate.

Figure 10B:
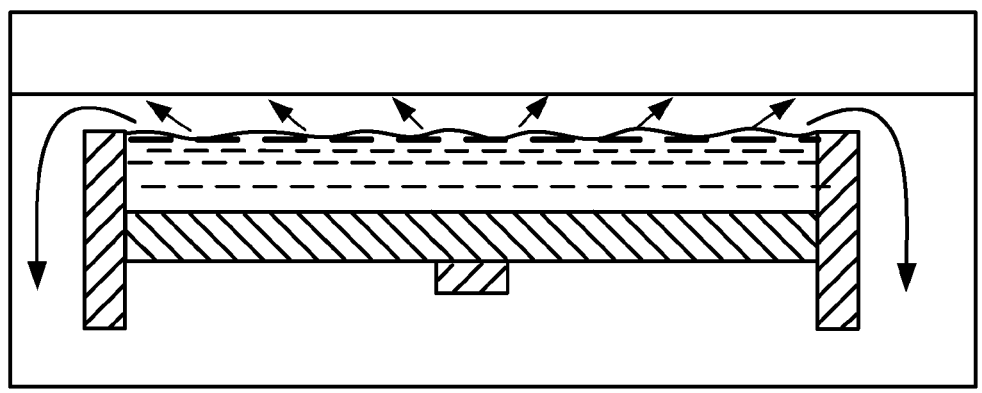
FIG. 10B is a simplified schematic diagram illustrating a vessel coupled to a pedestal at a second position according to an embodiment of the present invention.

FIG. 10B is a simplified schematic diagram illustrating a vessel coupled to a pedestal at a second position according to an embodiment of the present invention. As illustrated in FIG. 10B, the plunger has been moved to a second position higher than the first position. Accordingly, the heat transfer fluid has been largely expelled from the cylinder to make contact with the lower side of the heater plate. Accordingly, the heater plate is cooled through the contact with the heat transfer fluid. In the embodiment illustrated in FIGS. 10A and 10B, the heat transfer fluid does not undergo a phase change (e.g., from a liquid to a gas and back to a liquid). Of course, phase change materials may be utilized in alternative embodiments. After the plunger is returned to position illustrated in FIG. 10A, the heat transfer fluid is returned to the cylinder. The heat transfer fluid is cooled to the original temperature utilizing either the cooled plunger or the chill plate coupled to the bottom of the vessel depending on the application.

Figure 11A:
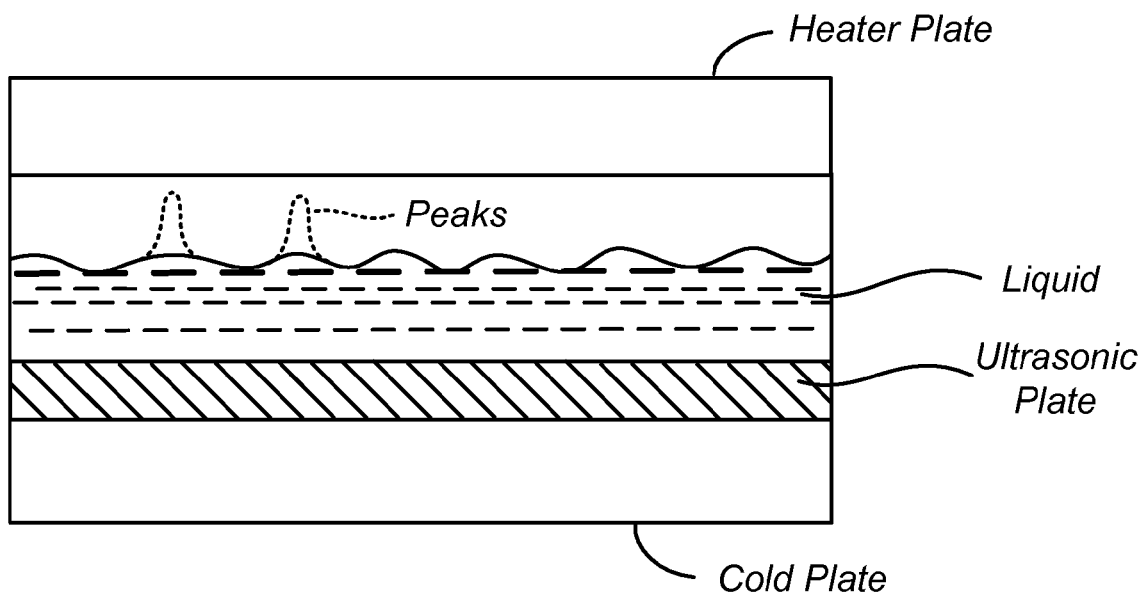
FIG. 11A is a simplified schematic diagram illustrating a vessel coupled to a pedestal according to another embodiment of the present invention.

FIG. 11A is a simplified schematic diagram illustrating a vessel coupled to a pedestal according to another embodiment of the present invention. As illustrated in FIG. 11A, an ultrasonic transducer is provided in contact with the heat transfer liquid. During ultrasonic activation, the liquid is ejected from the pool as illustrated by the dashed peaks and comes in contact with the lower side of the heater plate. The heater plate is quenched by the cooler liquid. Upon returning to the pool, the liquid is once again cooled through interaction with the cold plate.

Figure 11B:
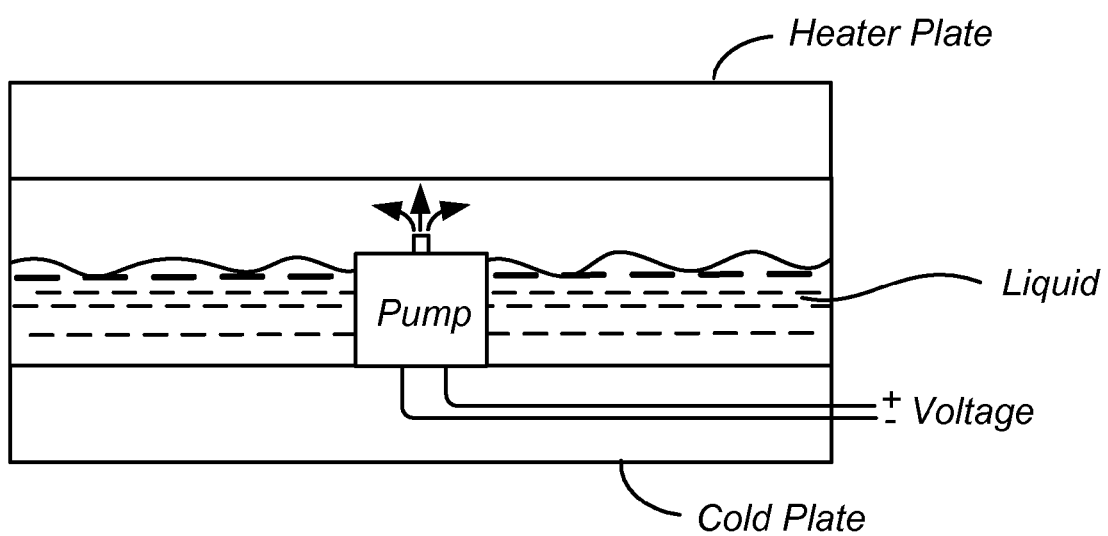
FIG. 11B is a simplified schematic diagram illustrating a vessel coupled to a pedestal according to yet another embodiment of the present invention.

FIG. 11B is a simplified schematic diagram illustrating a vessel coupled to a pedestal according to yet another embodiment of the present invention. As illustrated in FIG. 11B, a pump it utilized to spray the liquid on the underside of the heater plate, thereby quenching the heater plate. A voltage applied to the pump can be constant or variable (e.g., sinusoidal, triangular, pulsed, and the like) depending on the particular applications. As in the embodiment illustrated by FIG. 11A, during the circulation process the liquid is cooled by the cold plate, removes heat from the heater plate during contact, and is once again cooled by the cold plate. A non-phase change material or a phase change material may be utilized depending on the particular application. One of ordinary skill in the art would recognize many variations, modifications, and alternatives.

Figure 12:
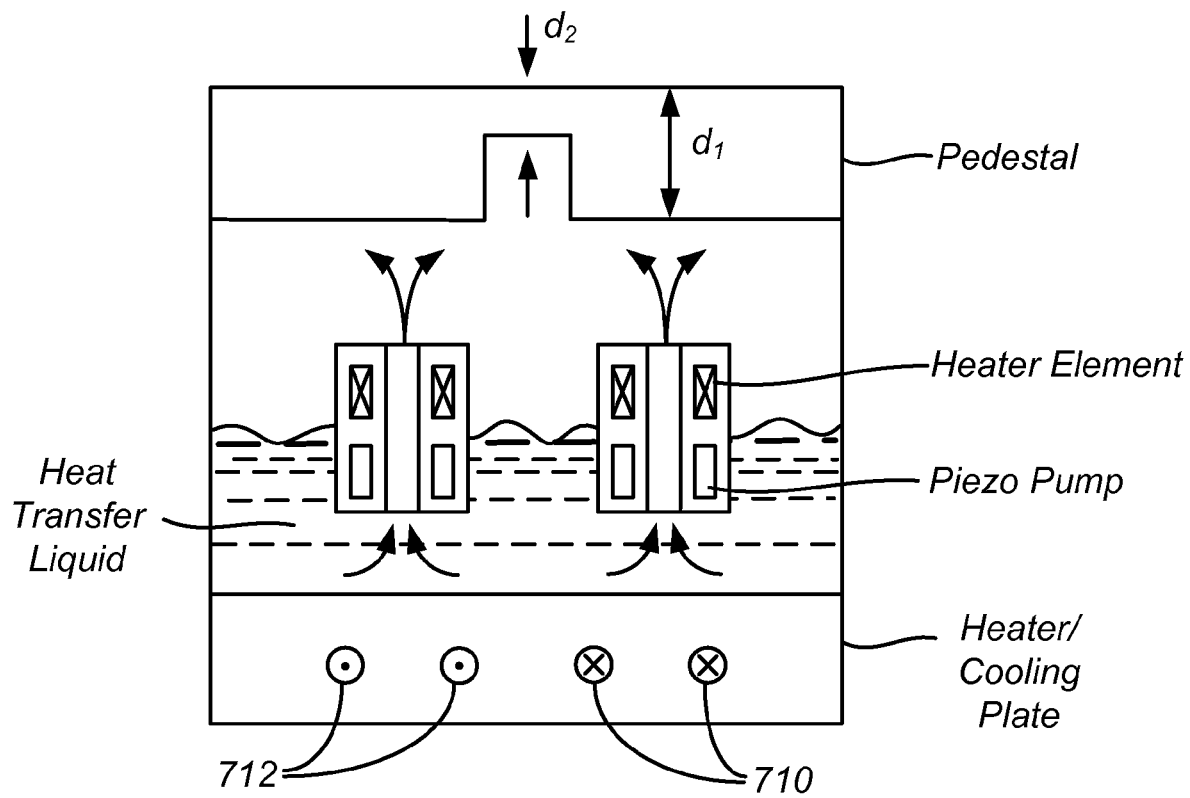
FIG. 12 is a simplified diagram illustrating an integrated thermal control system according to an embodiment of the present invention.

FIG. 12 is a simplified diagram illustrating an integrated thermal control system according to an embodiment of the present invention. As illustrated in FIG. 12, multiple thermal control techniques and systems are integrated into a single unit. Merely by way of example, a combination bake/quench plate is integrated with a multi-zone pedestal. Referring to FIG. 12, a heater/cooling plate includes a plurality of conductive structures adapted to provide a thermal input. In a specific embodiment, fluids enter the heater/cooling plate at orifices 1210 and exit at orifices 1212. Of course, resistive heaters may be utilized in place of fluids. The heating/cooling plate can be either heated or cooled depending on the particular applications. One of ordinary skill in the art would recognize many variations, modifications, and alternatives.

A heat transfer liquid (e.g., Galden) is placed in the apparatus in thermal contact with the heater/cooling plate. A pump (e.g., a piezoelectric pump) is provided in contact with the heat transfer liquid and is used to spray the heat transfer liquid on the underside of the pedestal, thereby heating or cooling the pedestal depending on the particular applications. Upon returning to the pool, the heat transfer liquid is once again returned to a temperature associated with the heater/cooling plate via the interaction with the plate.

As illustrated in FIG. 12, a voltage applied to the piezoelectric pump can be constant or variable (e.g., sinusoidal, triangular, pulsed, and the like) depending on the particular applications. In an application where the heater/cooling plate is utilized in a quenching process, during the circulation process, the heat transfer liquid is cooled by the heater/cooling plate, removes heat from the pedestal during contact, and is once again cooled by the heater/cooling plate. A non-phase change material or a phase change material may be utilized depending on the particular application. One of ordinary skill in the art would recognize many variations, modifications, and alternatives.

Referring to FIG. 12, the pump structures also include heater elements that may be used to tune the temperature of the heat transfer fluid. The thickness of the pedestal is varied as a function of position to provide thermal insulation between zone sections. As illustrated in FIG. 12, the thickness of the pedestal in a first portion is $d_1$ while a thickness in a second portion is $d_2$, which is less than $d_1$. Viewed in a top-view, the pedestal includes a number of zones defined radially, circumferentially, combinations thereof, and the like. The decreased thermal conductivity in the second portions (thickness $d_2$) results in partial thermal separation between zones, enabling, for example, the center of the wafer to be maintained at a temperature less than peripheral portions of the wafer. Although only two zones are illustrated in FIG. 7, this diagram is merely an illustration and is not intended to limit the scope of embodiments of the present invention.

In alternative embodiments, additional heating or cooling elements, for example, resistive heaters (not shown) are bonded to the pedestal or integrated in the pedestal, providing additional zone-based control of the pedestal temperature profile. One of ordinary skill in the art would recognize many variations, modifications, and alternatives. Moreover, combination pedestals are provided by some embodiments of the present invention. For example, an embodiment utilizes a two-part heater plate including a pedestal and a thermal element separated from the lower surface of the pedestal by a gap of predetermined size. The gap may be adjustable under control of a control loop to vary the thermal conductivity between the pedestal and the thermal element.

Merely by way of example, the thermal element may include orifices adapted to receive fluids, resistive heaters, thermoelectric elements, combinations thereof, and the like. Water jets may provide steam to the orifices of the thermal element to heat the thermal element during wafer baking processes. The gap of predetermined size is varied during some processes to provide temperature control during the process. For example, during a post-exposure bake (PEB) process, the gap may be modulated as a function of time to vary the thermal conductivity between the thermal element and the pedestal, and consequently the wafer temperature during the PEB process. During set point change operations, the gap between the thermal element and the pedestal may be decreased to quickly change the temperature of the pedestal. In a specific embodiment, the gap is reduced to zero as the thermal element is brought into contact with the pedestal.

Figure 13:
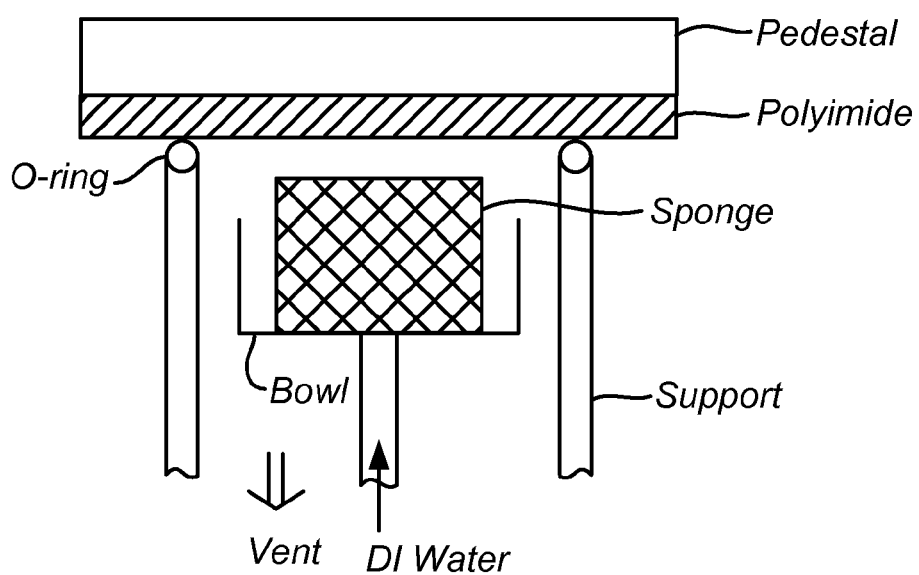
FIG. 13 is a simplified diagram illustrating another system for quenching a heater plate according to an embodiment of the present invention.

FIG. 13 is a simplified diagram illustrating another system for quenching a heater plate according to an embodiment of the present invention. As illustrated in FIG. 13, a cold "sponge" is supported in a bowl provided with a source of cooling liquid (e.g., DI water). The sponge is fabricated from a flexible material with the ability to absorb a fluid. The bowl is vertically moveable to bring the sponge in contact with the underside of the pedestal, thereby quenching the pedestal and consequently a wafer supported by the pedestal. In FIG. 8, a polyimide layer is bonded to the back of the pedestal and an O-ring is utilized to create a seal between the support and the polyimide layer. The cold sponge is supplied with a cooling fluid, which is circulated in some embodiments. In other embodiments, the sponge is periodically brought into contact with a cold fluid or supplied with a flow of cooling liquid. One of ordinary skill in the art would recognize many variations, modifications, and alternatives. A space is provided between the outer edges of the bowl and the support to allow any liquids or vapors at the sponge/polyimide layer interface to be removed. In an embodiment, the DI water in the sponge is vaporized and steam flows towards the vent as illustrated in FIG. 13.

While the present invention has been described with respect to particular embodiments and specific examples thereof, it should be understood that other embodiments may fall within the spirit and scope of the invention. The scope of the invention should, therefore, be determined with reference to the appended claims along with their full scope of equivalents.

What is claimed is:

1. A method of controlling wafer critical dimension (CD) uniformity on a track lithography tool, the method comprising:
    obtaining a CD map for a wafer, the CD map comprising a plurality of CD data points correlated with a multi-zone heater geometry map, wherein the multi-zone heater comprises a plurality of heater zones;
    determining a CD value for a first heater zone of the plurality of heater zones based on one or more of the CD data points;
    computing a difference between the determined CD value for the first heater zone and a target CD value for the first heater zone;
    determining a temperature variation for the first heater zone based, in part, on the computed difference and a temperature sensitivity of a photoresist deposited on the wafer;
    modifying a temperature of the first heater zone based, in part, on the temperature variation.

2. The method of claim 1 further comprising repeating the obtaining, determining a CD value, computing, determining a temperature variation, and modifying steps one or more times.

3. The method of claim 2 wherein repeating modifies a measured wafer CD to obtain a wafer CD within a predetermined value of a target wafer CD.

4. The method of claim 1 wherein the CD map for the wafer is obtained using an OCD metrology tool.

5. The method of claim 1 wherein the plurality of CD data points comprises a number of CD data points greater than or equal to the plurality of heater zones.

6. The method of claim 5 wherein the number of CD data points is greater than or equal to 29.

7. The method of claim 6 wherein the number of CD data points is greater than or equal to 66.

8. The method of claim 1 wherein the temperature sensitivity is associated with a functional relationship between CD and temperature.

9. The method of claim 1 wherein determining the CD value comprises averaging CD data points overlying the first heater zone.

10. The method of claim 1 wherein determining the CD value comprises computing a weighted average including a first set of CD data points overlying the first heater zone and a second set of CD data points not overlying the first heater zone.

11. A method of controlling CD during processing of semiconductor wafers, the method comprising:
    measuring a CD profile for a first semiconductor wafer;
    comparing the measured CD profile with a target CD profile;
    determining that the measured CD profile is not within a predetermined tolerance of the target CD profile;
    calculating a temperature offset for a zone of a multi-zone bake plate based on the determining step;
    modifying a temperature set point of the zone of the multi-zone bake plate; and
    processing a second semiconductor wafer using the modified temperature set point.

12. The method of claim 11 further comprising:
    calculating a second temperature offset for a second zone of the multi-zone bake plate based on the determining step; and
    modifying a second temperature set point of the second zone of the multi-zone bake plate.

13. The method of claim 11 wherein the CD profile is obtained using at least one of an OCD or a CD-SEM metrology tool.

14. The method of claim 11 wherein the CD profile comprises a number of CD data points greater than or equal to a number of heater zones of the multi-zone bake plate.

15. The method of claim 11 wherein determining that the measured CD profile is not within a predetermined tolerance of the target CD profile comprises computing a weighted average including a first set of CD data points overlying the zone and a second set of CD data points not overlying the zone.

16. A track lithography tool comprising:
    a factory interface configured to receive a wafer;
    a process module coupled to the factory interface, the process module comprising:
        a plurality of coat stations;
        a plurality of develop stations; and
        a thermal treatment unit including a multi-zone bake plate including a plurality of heater zones and characterized by a multi-zone bake plate geometry map; and
    a controller configured to receive a CD map for the wafer, the CD map comprising a plurality of CD data points correlated with the multi-zone bake plate geometry map, the controller including a computer-readable medium storing a plurality of instructions for controlling a data processor to modify a wafer CD profile, the plurality of instructions comprising:
        instructions that cause the data processor to determine a CD value for a first heater zone of the plurality of heater zones based on one or more of the CD data points;

instructions that cause the data processor to compute a difference between the determined CD value for the first heater zone and a target CD value for the first heater zone;

instructions that cause the data processor to determine a temperature variation for the first heater zone based, in part, on the computed difference and a temperature sensitivity of a photoresist deposited on the wafer; and instructions that cause the data processor to modify a temperature of the first heater zone based, in part, on the temperature variation.

17. The track lithography tool of claim 16 wherein the CD map for the wafer is obtained using a metrology tool integrated in the track lithography tool.

18. The track lithography tool of claim 16 wherein the CD map for the wafer comprises a number of CD data points greater than or equal to a number of heater zones of the multi-zone bake plate.

19. The track lithography tool of claim 16 wherein the determined CD value for the first heater zone is determined by computing a weighted average including a first set of CD data points overlying the first heater zone and a second set of CD data points not overlying the first heater zone.

20. The track lithography tool of claim 19 wherein the second set of CD data points overly a boundary region adjacent the first heater zone.

* * * * *